United States Patent
Riho et al.

(10) Patent No.: US 10,795,759 B2
(45) Date of Patent: Oct. 6, 2020

(54) APPARATUSES AND METHODS FOR ERROR CORRECTION CODING AND DATA BUS INVERSION FOR SEMICONDUCTOR MEMORIES

(71) Applicant: Micron Technology, Inc., Boise, ID (US)

(72) Inventors: Yoshiro Riho, Koganei (JP); Atsushi Shimizu, Hachioji (JP); Sang-Kyun Park, Boise, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 16/126,991

(22) Filed: Sep. 10, 2018

(65) Prior Publication Data

US 2020/0081769 A1    Mar. 12, 2020

(51) Int. Cl.
| | | |
|---|---|---|
| *G06F 11/10* | (2006.01) | |
| *G11C 29/42* | (2006.01) | |
| *G11C 29/52* | (2006.01) | |
| *H03M 13/00* | (2006.01) | |
| *G11C 29/04* | (2006.01) | |
| *G06F 13/42* | (2006.01) | |

(52) U.S. Cl.
CPC ...... *G06F 11/1048* (2013.01); *G06F 11/1044* (2013.01); *G11C 29/42* (2013.01); *G11C 29/52* (2013.01); *H03M 13/616* (2013.01); *G06F 13/4234* (2013.01); *G11C 2029/0411* (2013.01)

(58) Field of Classification Search
CPC .. G06F 11/10; G06F 11/1625; G06F 11/1008; G06F 11/1044; G06F 11/1048; G11C 29/42; G11C 29/52
See application file for complete search history.

(56) References Cited

U.S. PATENT DOCUMENTS

| | | |
|---|---|---|
| 7,523,380 B1 | 4/2009 | Trimberger |
| 9,690,653 B2 | 6/2017 | Suzuki |

(Continued)

FOREIGN PATENT DOCUMENTS

| | | |
|---|---|---|
| KR | 1020130101149 A | 9/2013 |
| KR | 1020170002053 A | 1/2017 |

OTHER PUBLICATIONS

International Search Report and Written Opinion for PCT Application No. PCT/US2019/050177 dated Dec. 24, 2019, 9 pgs.

(Continued)

*Primary Examiner* — Shelly A Chase
(74) *Attorney, Agent, or Firm* — Dorsey & Whitney LLP

(57) ABSTRACT

Apparatuses and methods for error correction coding and data bus inversion for semiconductor memories are described. An example apparatus includes an I/O circuit configured to receive first data and first ECC data associated with the first data, a memory array, and a control circuit. The control circuit is coupled between the I/O circuit and the memory array. The control circuit is configured to execute first ECC-decoding to produce corrected first data and corrected first ECC data responsive, at least in part, to the first data and the first ECC data. The control circuit is further configured to store both the corrected first data and the corrected first ECC data into the memory array.

20 Claims, 16 Drawing Sheets

(56) References Cited

U.S. PATENT DOCUMENTS

| | | | |
|---|---|---|---|
| 2012/0204082 A1* | 8/2012 | Shen | G06F 11/10 |
| | | | 714/800 |
| 2014/0053040 A1* | 2/2014 | Hargan | G06F 11/10 |
| | | | 714/755 |
| 2015/0227417 A1* | 8/2015 | Kim | G06F 11/1008 |
| | | | 714/764 |
| 2016/0203045 A1 | 7/2016 | Suzuki | |
| 2018/0004596 A1 | 1/2018 | Zhang et al. | |

OTHER PUBLICATIONS

TW Office Action dated May 12, 2020 for TW application No. 108129194.

* cited by examiner

APPARATUSES AND METHODS FOR ERROR CORRECTION CODING AND DATA BUS INVERSION FOR SEMICONDUCTOR MEMORIES

BACKGROUND

In recent years, a semiconductor device, such as a DRAM (Dynamic Random Access Memory), has had a greatly-increased capacity, and the number of occurrences of defective bits has also increased accordingly. Of the defective bits, ones due to a defective word line or a defective bit line are mainly relieved by replacement with a redundant word line or a redundant bit line. However, regarding sporadic defective bits occurring after packaging or the like, it is difficult in some cases to relieve them by replacement with a redundant word line or a redundant bit line. For such sporadic defective bits, a method of relieving data by using an error correcting function, not by performing replacement using a redundant circuit is adopted in some cases. Error correcting may be used internally within a semiconductor device, and also externally for transferring data to and from the semiconductor device.

Additionally, there is a desire to reduce power consumption by semiconductor devices. An approach that has been used is to include data bus inversion (DBI) when communicating data to and from the semiconductor devices. In systems including DBI, the data transferred to and from the semiconductor device may be DBI encoded to reduce a number of signal transitions on signal lines. In particular, data to be transferred is evaluated against previously transferred data to determine whether more than a threshold number of signal line transitions are needed to transfer the data. Based on the evaluation, the data to be transferred is provided either as true data (not inverted) or inverted data. The DBI encoding results in DBI data indicative of whether the data is inverted or not, which is provided with the DBI encoded data to be used when decoding the data.

With regards to error correction functions, the semiconductor devices include ECC encoding and/or ECC decoding circuits for performing the error correcting function. In performing the error correcting functions, encoding and decoding of the data requires time for processing, which may negatively affect performance of the semiconductor devices.

It may be desirable to have alternative approaches to performing error correcting functions in semiconductor devices, which may also include DBI operations.

BRIEF DESCRIPTION OF THE DRAWINGS

FIGS. 7A-1, 7A-2, and 7A-3, and 7B are diagrams of determinants (e.g., H-Matrices) or performing ECC encoding and/or decoding operations according to an embodiment of the disclosure.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the disclosure described herein should not be construed to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
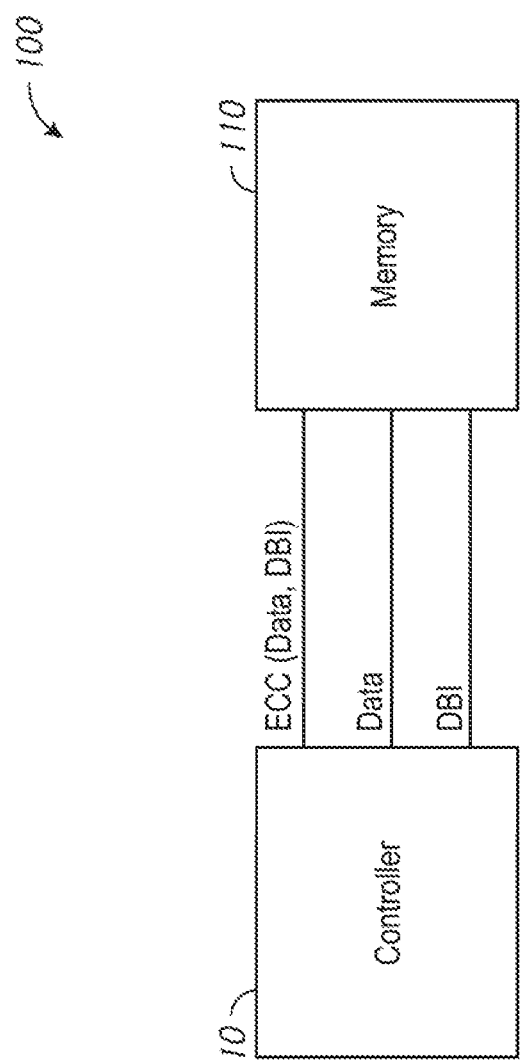
FIG. 1 is a block diagram of a system according to an embodiment of the disclosure.

FIG. 1 is a block diagram of a system 100 that includes a controller 10 and a memory 110. The memory controller 10 may be a memory controller, for example. In some embodiments of the disclosure, the memory 110 includes one or more dynamic random access memory (DRAM) devices. In such embodiments, the DRAM devices may include low power double data rate (LPDDR) memory devices. In other embodiments, different examples of memory devices may be included.

The controller 10 and memory 110 may provide data between each other, for example, the controller 10 provides write data to the memory 110 for write operations and the memory 110 provides read data to the controller 10 for read operations. The controller 10 and memory 110 utilize error correction coding (ECC) for the data that is provided between the two. For example, ECC data may be provided by the controller 10 to the memory 110 with the write data, and ECC data may be provided by the memory 110 to the controller 10 with the read data. The ECC data may be used by the memory 110 and/or controller 10 to correct any errors in the write data and/or read data. In this manner, the accuracy of data transferred on the communication link between the memory 110 and controller 10 may be ensured.

In some embodiments of the disclosure, data bus inversion (DBI) may be used for the data provided between the controller 10 and the memory 110. In such embodiments, DBI data is provided between the controller 10 and the memory 110 with the write and read data, respectively. Additionally, in some embodiments of the disclosure that include DBI operations, the DBI data is ECC encoded, and as a result, ECC data for the DBI data is also provided along with the ECC data for the data itself. The ECC data for the data and the DBI data may be included in ECC data ECC (Data, DBI).

As shown in FIG. 1, ECC (Data, DBI), Data, and DBI data are provided between the controller 10 and the memory 110. Although not shown in FIG. 1, it will be appreciated that the controller 10 further provides commands, addresses, and clocks to the memory 110. Clocks may also be provided by the memory 110 to the controller 10 in some embodiments. The commands may be provided to control operations of the memory 110, and the addresses may be provided with memory access commands (e.g., read commands, write commands, etc.) to identify memory locations in the memory 110 to be accessed. The clocks provided by the controller 10 may be used by the memory 110 for timing receipt of signals and for various operations for the memory 110, and in embodiments where the memory 110 provides clocks to the controller 10, the clocks may be used by the controller for timing receipt of read data provided by the memory. Additional and/or alternative signals may be provided between the controller 10 and the memory 110 as well.

Figure 2:
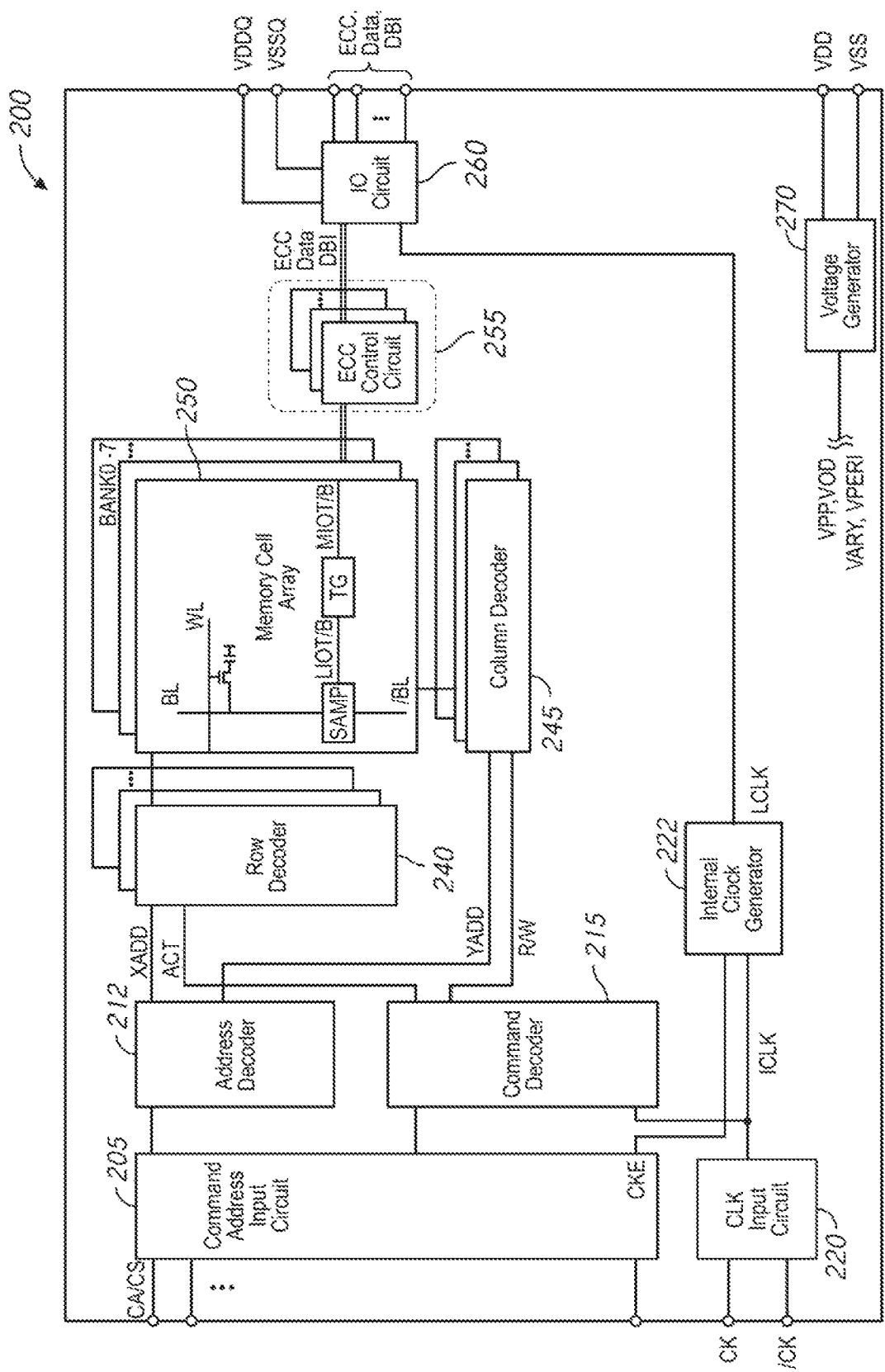
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred to as such. In some embodiments, the semiconductor device 200 may include, without limitation, a DRAM device, such as low power DDR (LPDDR) memory integrated into a single semiconductor chip, for example. The semiconductor device 200 may be included in the memory 110 of FIG. 1 in some embodiments of the disclosure.

The semiconductor device 200 includes a memory array 250. The memory array 250 is shown as including a plurality of banks. In the embodiment of FIG. 2, the memory array 250 is shown as including eight banks BANK0-BANK7. Each bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 240 and the selection of the bit lines BL and /BL is performed by a column decoder 245. In the embodiment of FIG. 2, the row decoder 240 includes a respective row decoder for each bank and the column decoder 245 includes a respective column decoder for each bank. The bit lines BL and /BL are coupled to a respective sense amplifier (SAMP). Read data from the bit line BL or /BL is amplified by the sense amplifier SAMP, and transferred to an ECC control circuit 255 over complementary local data lines (LIOT/B), transfer gate (TG), and complementary main data lines (MIOT/B). The ECC control circuit 255 includes a respective ECC control circuit for each bank.

As will be described in more detail below, when the read data is read from the memory cell array 250, corresponding ECC data is also simultaneously read. Conversely, write data and corresponding ECC data outputted from the ECC control circuit 255 are transferred to the sense amplifier SAMP over the complementary main data lines MIOT/B, the transfer gate TG, and the complementary local data lines LIOT/B, and written in the memory cell MC coupled to the bit line BL or /BL. As will be described in more detail below, when the write data is written in the memory array 250, the corresponding ECC data is also simultaneously written.

The semiconductor device 200 may employ a plurality of external terminals that include command and address and chip select (CA/CS) terminals coupled to a command and address bus to receive commands and addresses, and a CS signal, clock terminals to receive clocks CK and /CK, data terminals, and power supply terminals VDD, VSS, VDDQ, and VSSQ.

The CA/CS terminals may be supplied with memory addresses. The memory addresses supplied to the CA/CS terminals are transferred, via a command/address input circuit 205, to an address decoder 212. The address decoder 212 receives the address and supplies a decoded row address XADD to the row decoder 240 and supplies a decoded column address YADD to the column decoder 245. The CA/CS terminals may be supplied with commands. The commands may be provided as internal command signals to a command decoder 215 via the command/address input circuit 205. The command decoder 215 includes circuits to decode the internal command signals to generate various internal signals and commands for performing operations. For example, the command decoder 215 may provide a row command signal ACT to select a word line and a column command signal R/W to select a bit line.

When a read command is received, and a row address and a column address are timely supplied with the read command, read data and the corresponding ECC data are read from memory cells in the memory array 250 designated by the row address and column address. The read command is received by the command decoder 215, which provides internal commands so that read data and the corresponding ECC data from the memory array 250 are provided to the ECC control circuit 255. The ECC control circuit 255 executes ECC-decoding to produce corrected read data and corrected corresponding ECC data. For example, if the read data includes an error, as determined by the ECC control circuit 255 based on the corresponding ECC data, the read data is corrected. The corrected read data and the corrected corresponding ECC data are output to outside from the data terminals via the input/output circuit 260.

"Corrected data" generally refers to data produced following ECC decoding based on corresponding ECC data. The corrected data includes data that may have actually been corrected (e.g., one or more bits of the data are changed), when necessary, as well as data that may not have been corrected because correction was unnecessary. For example, "corrected" read data provided following ECC decoding refers to the read data provided whether actually corrected or not based on the corresponding ECC data. Similarly, "corrected" ECC data provided following ECC decoding refers to the ECC data provided whether corrected or not. Thus, the term "corrected" is not intended to refer to only data that has actually been corrected, but more generally refers to data that is provided following ECC decoding whether actually corrected or not. The term "corrected data" may also be applied to write data, DBI data, ECC (DBI) data, and the like.

When the write command is received, and a row address and a column address are timely supplied with the write command, write data and corresponding ECC data supplied to the data terminals are written to a memory cells in the memory array 250 designated by the row address and column address. The write command is received by the command decoder 215, which provides internal commands so that the write data and the corresponding ECC are received by data receivers in the input/output circuit 260, and supplied via the input/output circuit 260 to the ECC control circuit 255. The ECC control circuit 255 executes ECC-decoding to produce corrected write data and corrected corresponding ECC data. For example, if the write data includes an error, as determined by the ECC control circuit 255 based on the corresponding ECC data, the write data is corrected. The corrected write data and corrected corresponding ECC data are provided by the ECC control circuit 255 to the memory array 250 to be written into the memory cell MC.

In some embodiments of the disclosure, data bus inversion (DBI) operations may be included in the semiconductor device 200. However, including DBI operations in the semiconductor device 200 is optional, and some embodiments of the disclosure do not include DBI operations. Additionally, ECC operations for read data provided by the semiconductor device 200 and/or write data received by the semiconductor device 200 is optional, and some embodiments of the disclosure do not include ECC operations.

In embodiments of the disclosure that include ECC and DBI operations, with regards to the semiconductor device 200 providing read data for a read command, the ECC control circuit 255 may execute ECC-decoding on read data and corresponding ECC data to produce intermediate read data and corrected corresponding ECC data. The ECC control circuit 255 may execute DBI-encoding on the intermediate read data to provide corrected read data and DBI data, and further execute ECC-encoding on the DBI data to produce DBI ECC data. The corrected read data, corrected corresponding ECC data, the DBI data, and DBI ECC data are output to outside via the input/output circuit 260.

With regards to the semiconductor device 200 for a write command, write data (that is DBI encoded), corresponding ECC data, DBI data, and DBI ECC data is received by the input/output circuit 260 and provided to the ECC control circuit 255. The ECC control circuit 255 may execute ECC-decoding on the (DBI encoded) write data and the corresponding ECC data to produce intermediate (DBI encoded) write data and corrected corresponding ECC data. The ECC control circuit 255 may execute ECC-decoding on the DBI data and the DBI ECC data to produce corrected DBI data, and execute DBI-decoding on the intermediate (DBI encoded) write data based on the corrected DBI data to produce corrected write data. The corrected write data and the corrected corresponding ECC data are provided by the ECC control circuit 255 to the memory array 250 to be written into the memory cell MC.

Error correction performed by the ECC control circuit 255 may be used to maintain accuracy of data provided to and from the semiconductor device 200 externally, for example, data provided between a controller and the semiconductor device 200. In some embodiments of the disclosure, the ECC control circuit 255 may further perform error correction encoding/decoding to correct data errors that occur when reading data from and/or writing data to the memory array 250. Such data errors may result from, for example, soft errors, weak memory cell charge retention, etc. Such embodiments of the disclosure may include embodiments where the ECC encoding/decoding for memory bank errors are performed separately (e.g., serially) from the ECC encoding/decoding for data errors occurring over a link between the semiconductor device 200 and a controller, for example, as well as embodiments where the ECC encoding/decoding for memory bank errors and the ECC encoding/decoding for data errors occurring over a link are combined.

The clock terminals CK and /CK are supplied with external clocks that are provided to an input buffer 220. The external clocks may be complementary. The clock input buffer 220 generates an internal clock ICLK based on the CK and /CK clocks. The ICLK clock is provided to the command decoder 215 and to an internal clock generator 222. The internal clock generator 222 provides various internal clocks LCLK based on the ICLK clock. The LCLK clocks may be used for timing the operation of various internal circuits. For example, the clocks may be provided to the input/output circuit 260 for timing the operation of the input/output circuit 260 to provide and receive data and corresponding ECC data, and in embodiments of the disclosure that include DBI operation, provide and receive DBI data and DBI ECC data.

The power supply terminals VDD and VSS are supplied with power supply potentials. These power supply potentials are supplied to an internal voltage generator circuit 270. The internal voltage generator circuit 270 generates various internal potentials VPP, VOD, VARY, VPERI, and the like based on the power supply potentials supplied to the power supply terminals VDD and VSS. The internal potential VPP is mainly used in the row decoder 240, the internal potentials VOD and VARY are mainly used in the sense amplifiers SAMP included in the memory array 250, and the internal potential VPERI is used in many peripheral circuit blocks.

The power supply terminals VDDQ and VSSQ are also supplied with power supply potentials. The power supply potentials are supplied to the input/output circuit 260. The power supply potentials supplied to the power supply terminals VDDQ and VSSQ may be the same potentials as the power supply potentials supplied to the power supply terminals VDD and VSS in an embodiment of the disclosure. The power supply potentials supplied to the power supply terminals VDDQ and VSSQ may be different potentials from the power supply potentials supplied to the power supply terminals VDD and VSS in another embodiment of the disclosure. The power supply potentials supplied to the power supply terminals VDDQ and VSSQ are used for the input/output circuit 260 so that power supply noise generated by the input/output circuit 260 does not propagate to the other circuit blocks.

Figure 3A:
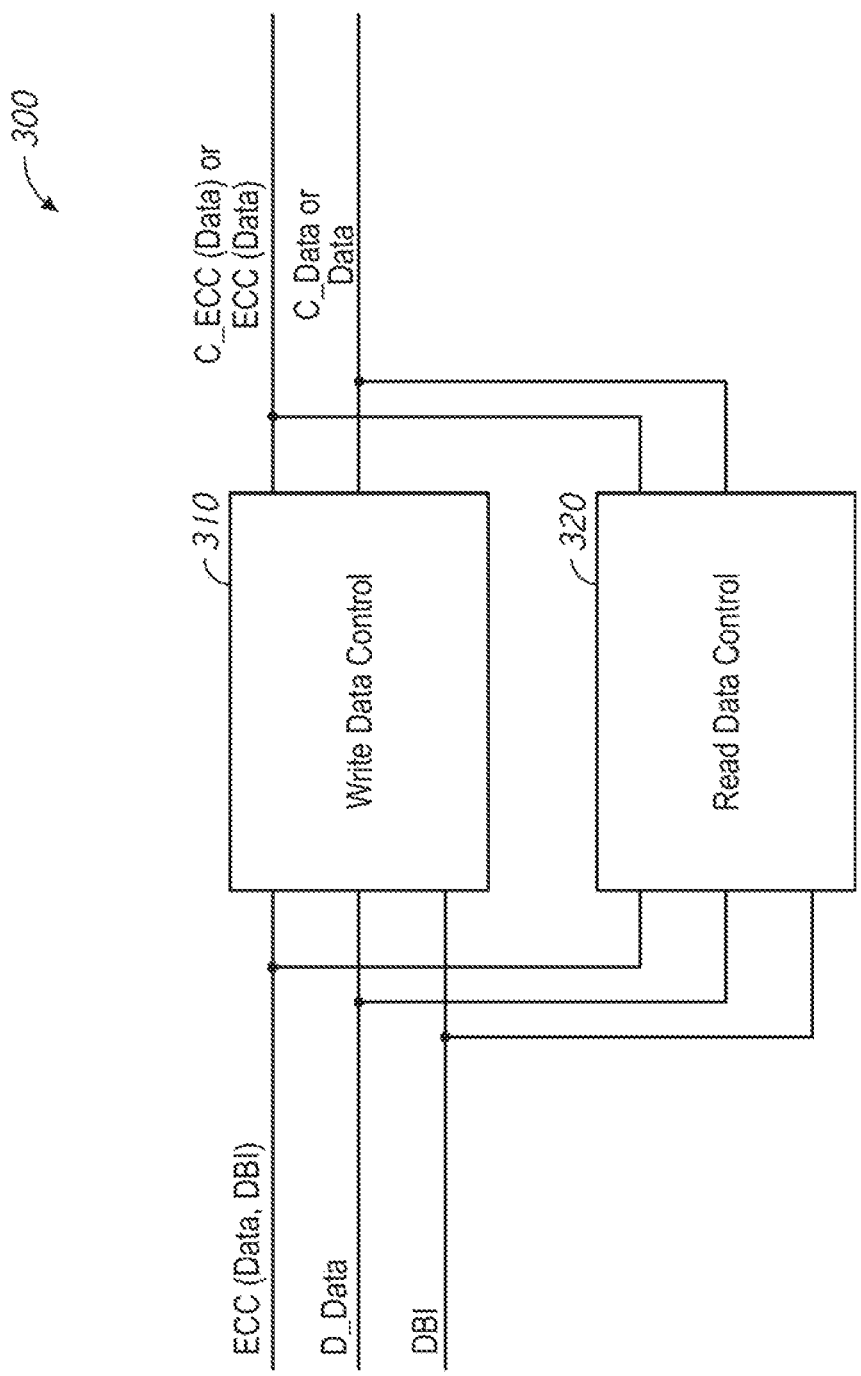
FIG. 3A is a block diagram of an ECC control circuit according to an embodiment of the disclosure.

FIG. 3A is a block diagram of an ECC control circuit 300 according to an embodiment of the disclosure. The ECC control circuit 300 may be included in the ECC control circuit 255 of the semiconductor device 200 of FIG. 2 in some embodiments of the disclosure.

The ECC control circuit 300 includes a write data control circuit 310 and a read data control circuit 320. The write data control circuit 310 receives data, ECC data, and data bus inversion (DBI) data. The data may be DBI encoded data "D_Data," and the ECC data "ECC (Data, DBI)" may include ECC data for the data "ECC (Data)" and ECC data for the DBI data "ECC (DBI)." The ECC data, D_Data, and DBI data may be provided to the ECC control circuit 300 by an input/output circuit, for example, the input/output circuit 260 of the semiconductor device 200 in some embodiments of the disclosure. The ECC data, D_Data, and DBI data may be provided to the input/output circuit from a controller, for example.

Although not shown in FIG. 3A, the write data control circuit 310 uses the ECC (DBI) to correct the DBI data to provide (e.g., produce) corrected DBI data "C_DBI," which is used by the write data control circuit 310 to DBI decode the D_Data to provide DBI decoded data "Data." The Data is corrected by the write data control circuit 310 using the ECC (Data) to provide corrected data "C_Data." The write data control circuit 310 further provides the ECC (Data) as corrected ECC data "C_ECC (Data)." In some embodiments of the disclosure, the C_ECC (Data) is the same as the ECC (Data) used to correct the Data, and provided to the write data control circuit 310 along with ECC (DBI).

The C_Data and the C_ECC (Data) may be provided for writing to memory cells of a memory array (e.g., memory array 250 of the semiconductor device 200 of FIG. 2, in some embodiments of the disclosure). In some embodiments of the disclosure, the C_Data and the C_ECC (Data) may be written to memory cells of the memory array with additional error correction coding, such as a bank ECC, that may be used to correct errors that can occur while the C_Data and C_ECC (Data) are stored in the memory array. Bank ECC may be used, for example, to correct soft errors, memory cell retention errors, etc. The Bank ECC encoding may be performed on the data provided by the write data control circuit 310, in some embodiments, in series, and in other embodiments, in combination. In some embodiments of the disclosure, the C_Data and the C_ECC (Data) may be written to memory cells without any additional error correction coding.

The C_ECC (Data) may be based on the ECC data ECC (Data) provided to the write data control circuit 310. In some embodiments of the disclosure, the C_ECC (Data) provided by the write data control circuit 310 is the same as the ECC (Data) provided to the write data control circuit 310. By not performing an ECC encoding operation on the data to provide the C_ECC (Data), the time to prepare the data and ECC data to be stored in memory may be reduced compared to the conventional approach.

The read data control circuit 320 receives data and ECC data for the data ECC (Data). In some embodiments of the disclosure, the data and ECC (Data) may be stored in a memory array and provided to the read data control circuit 320 responsive to a read command. For example, in some embodiments of the disclosure, the data and the ECC (Data) are stored in a memory array, and when a read command is received, the data and the ECC (Data) are provided from the memory array to the ECC control circuit 300 without any additional error correction decoding. In some embodiments of the disclosure, however, the data and ECC (Data) from the memory array is ECC decoded before being provided to the ECC control circuit 300. Separate Bank ECC may be used for correcting any errors that may have occurred while stored in the memory array, for example, to correct soft errors, memory cell retention errors, etc.

The read data control circuit 320 corrects the data it receives using the ECC (Data), performs DBI encoding on the corrected data to provide DBI encoded data D_Data and generates DBI data accordingly. The read data control circuit 320 further generates ECC data ECC (DBI) for the DBI data. The read data control circuit 320 provides the D_Data, DBI data, and ECC (Data, DBI), for example, to a controller. The ECC (Data) may be based on ECC data stored with the data in memory. In some embodiments of the disclosure, the ECC (Data) is the same ECC data that is stored with the plain data (pre-DBI encoding).

The read data control circuit 320 may provide the ECC (Data) without the need for performing an ECC encoding operation on the data that is provided with the ECC (Data) from the memory array. The ECC (Data) provided by the read data control circuit 320 with the read data may be based on the ECC (Data) provided to the read data control circuit 320 for example, the ECC (Data) stored in the memory array along with the read data. In some embodiments of the disclosure, the ECC (Data) provided by the read data control circuit 320 is the same as the ECC (Data) provided to the read data control circuit 320 from the memory array. By not performing an ECC encoding operation on the data to provide the ECC (Data), the time to prepare the data and ECC data that is provided by the read data control circuit 320 may be reduced compared to the conventional approach.

In some embodiments of the disclosure, the ECC operations performed by the write data control circuit 310 and the read data control circuit 320 are based on a common (e.g., same) determinant (e.g., H-Matrix). For example, both the write data control circuit 310 and the read data control circuit 320 may use a same H-Matrix for ECC decoding and/or ECC encoding. By using a common H-Matrix, as in some embodiments of the disclosure, one or more ECC encoding operations may be omitted compared to conventional approaches for using ECC operations in memory systems.

An example H-Matrix and error correction circuits are described in U.S. Pat. No. 9,690,653, filed Sep. 11, 2015 and issued Jun. 27, 2017, the entire disclosure of which is hereby incorporated by reference.

As previously described, additional error correction coding may be performed on data and ECC (Data) provided by an ECC control circuit 300 (e.g., ECC control circuit 300) in some embodiments of the disclosure. For example, Bank ECC encoding may be performed on the data and ECC (Data) provided by the ECC control circuit 300.

Figure 3B:
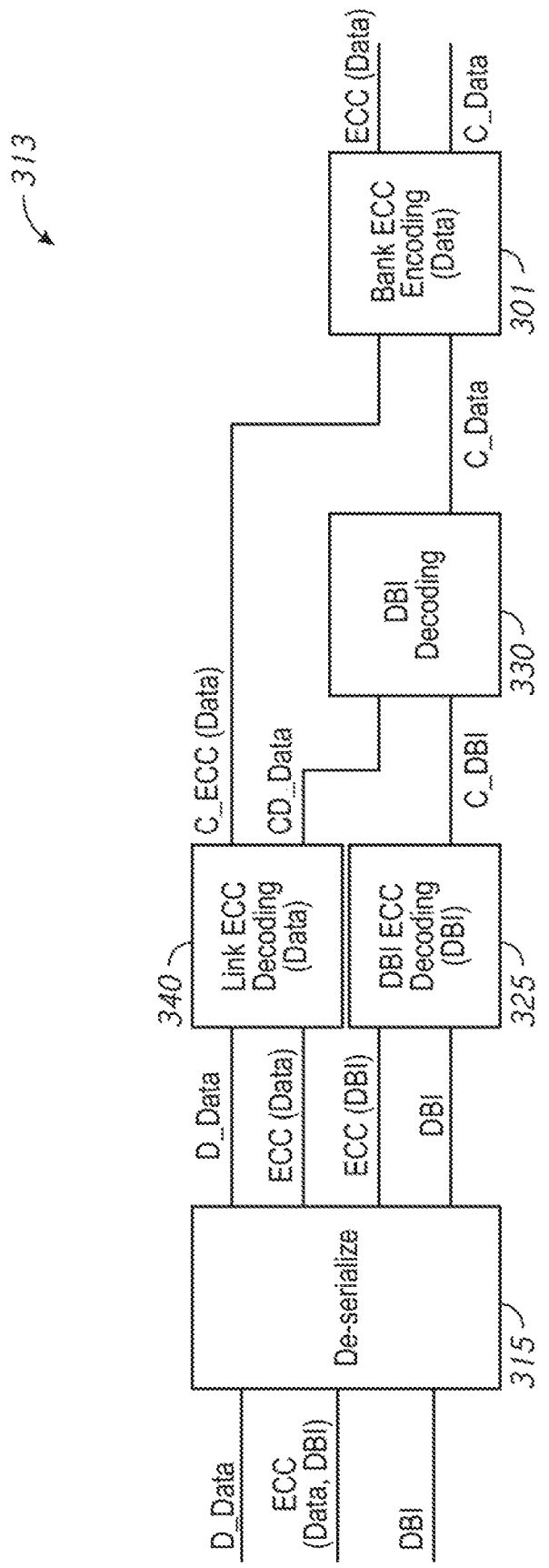
FIG. 3B is a block diagram of a write data control circuit according to an embodiment of the disclosure.

FIG. 3B is a block diagram of write data control circuit 313 according to an embodiment of the disclosure. The write data control circuit 313 is shown in FIG. 3B as providing corrected data C_Data and corrected ECC data C_ECC (Data) to a bank ECC encoding circuit 301. The write data control circuit 313 may be included in the write data control circuit 310 of the ECC control circuit 300 of FIG. 3A in some embodiments of the disclosure.

The write data control circuit 313 includes de-serialize circuit 315 that is provided DBI encoded data "D_Data," ECC data "ECC (Data, DBI)," and DBI data "DBI." The ECC (Data, DBI) provided to the de-serialize circuit 315 may include ECC data for the data that is DBI encoded "ECC (Data)" and ECC data for the DBI data "ECC (DBI)." The D_Data, ECC (Data, DBI), and DBI data may be provided in a serial manner. The de-serialize circuit 315 de-serializes the D_Data, ECC (Data, DBI), and DBI data and provides the D_Data, ECC (Data), ECC (DBI), and DBI data in a parallel manner. Serial and parallel manners of providing data are later described with reference to FIG. 4.

The write data control circuit 313 includes an ECC decoding circuit 325. The ECC decoding circuit 325 is provided ECC (DBI) and the DBI data from the de-serialize circuit 315. The ECC decoding circuit 325 corrects the DBI data using the ECC (DBI) and provides corrected DBI data "C_DBI." The write data control circuit 313 further includes an ECC decoding circuit 340. The D_Data is provided along with the ECC (Data) to the ECC decoding circuit 340 which corrects the D_Data using the ECC (Data) to provide corrected DBI encoded data "CD_Data," which may be considered to be intermediate data. The ECC decoding circuit 340 further provides the ECC (Data) as corrected ECC data "C_ECC (Data)." In some embodiments of the disclosure, the C_ECC (Data) is the same as the ECC (Data) used to correct the Data, and that was provided to the de-serialize circuit 315 along with ECC (DBI).

The CD_Data is provided along with the C_DBI to a DBI decoding circuit 330 that is also included in the write data control circuit 313. The DBI decoding circuit 330 decodes the CD_Data using C_DBI to provide corrected data "C_Data." The C_Data and C_ECC (Data) are provided to bank ECC encoding circuit 301, which ECC encodes the C_Data and C_ECC (Data) to provide ECC (Data) and the C_Data. The ECC (Data) and the C_Data may be provided to a memory array for storage.

In the write data control circuit 313, ECC decoding for (DBI encoded) D_Data and ECC decoding for DBI data are performed in parallel by the ECC decoding circuit 340 and ECC decoding circuit 325, respectively. In the arrangement of the write data control circuit 313, with the ECC decoding for D_Data and ECC decoding for DBI data performed in parallel, the ECC decoding of D_Data occurs prior to DBI decoding of (corrected) DBI encoded data CD_Data. For embodiments of the disclosure, such as the write data control circuit 313, where DBI encoded data CD_Data is ECC decoded by an ECC decoding circuit, it is preferable that the results of ECC decoding of the DBI encoded data CD_Data provides the same calculation results as for ECC decoding of plain Data. That is, there would not be any problems with ECC decoding to correct an error in the DBI encoded data CD_Data.

Figure 3C:
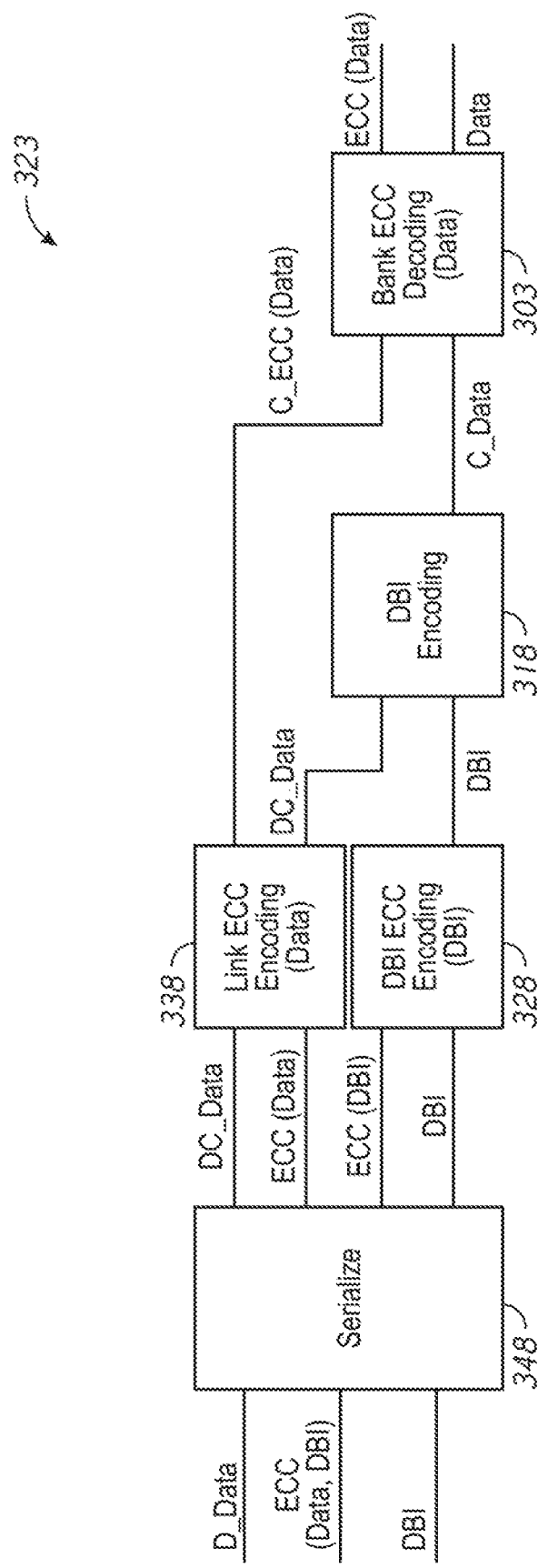
FIG. 3C is a block diagram of a read data control circuit according to an embodiment of the disclosure.

FIG. 3C is a block diagram of a read data control circuit 323 according to an embodiment of the disclosure. The read data control circuit 323 is shown in FIG. 3C as receiving ECC (Data) and Data from bank ECC decoding circuit 303. The read data control circuit 323 may be included in the read data control circuit 320 of the ECC control circuit 300 of FIG. 3A in some embodiments of the disclosure.

The bank ECC decoding circuit 303 is provided "Data" and ECC data for the Data "ECC (Data)," for example, from a memory array. The bank ECC decoding circuit 303 corrects the Data using the ECC (Data) to provide corrected data "C_Data," which may be considered to be intermediate data. The bank ECC decoding circuit 303 further provides the ECC (Data) as corrected ECC data "C_ECC (Data)." In some embodiments of the disclosure, the C_ECC (Data) is the same as the ECC (Data) used to correct the Data, and that was provided to the bank ECC decoding circuit 303 along with the Data. As previously described, bank error correction coding may be used for correcting any errors that may have occurred while stored in the memory array.

The C_Data is provided to a DBI encoding circuit 318. The DBI encoding circuit 318 evaluates the C_Data and encodes the C_Data accordingly to provide DBI encoded corrected Data "DC_Data." The DBI encoding circuit 318 further provides DBI data "DBI" that indicates whether the DC_Data is true or the complement to the C_Data. The DBI data is provided to an ECC encoding circuit 328. The ECC encoding circuit 328 evaluates the DBI data and provides ECC data for the DBI data "ECC (DBI)" based on the DBI data. The ECC (DBI) may be used, for example, by a controller, to correct the DBI data. The DC_Data is provided to an ECC encoding circuit 338. The ECC encoding circuit 338 evaluates the DC_Data and provides ECC data for the DC_Data "ECC (Data)" based on the DC_Data data. The ECC (Data) may be used, for example, by the controller, to correct the DC_Data. In the read data control circuit 323, ECC encoding for (DBI encoded) DC_Data and ECC encoding for DBI data are performed in parallel by the ECC encoding circuit 338 and ECC encoding circuit 328, respectively.

The ECC (DBI) and the DBI data are provided by the ECC encoding circuit 328 to a serialize circuit 348. The serialize circuit 348 is also provided the ECC (Data) and the DC_Data by the ECC encoding circuit 338. The serialize circuit 348 is provided the DC_Data, ECC (Data), DBI data, and ECC (DBI) in parallel, and serializes the same to provide D_Data, DBI data, and ECC data for the D_Data and the DBI data "ECC (Data, DBI)" in a serial manner. The D_Data, DBI data, and ECC (Data, DBI) may be provided, for example, to a controller.

The ECC data C_ECC (Data) for the D_Data may be provided by the read data control circuit 323 without the need for performing an ECC encoding operation on the Data or C_Data. For example, the ECC data C_ECC (Data) may have been encoded using a common (e.g., same) determinant (e.g., H-Matrix) as is used for ECC decoding of the D_Data based on the C_ECC (Data), such as by the controller to which the C_ECC (Data) and D_Data are provided, and/or by a write data controller circuit which provides data and ECC (data) that is written to a memory array, and which may be later provided to the read data control circuit 323 for a read operation. By having the same ECC operations performed (e.g., by a controller and also by a semiconductor device) based on the same H-Matrix may allow for one or more ECC encoding operations of the D_Data to be avoided.

In embodiments of the disclosure that include the read data control circuit 323, the write data control circuit 313 of FIG. 3B may be used to perform operations for providing the C_Data and C_ECC (Data) that is written to a memory array, which are later provided to the read data control circuit 323 responsive to a read operation. ECC decoding performed by the write data control circuit 313 may be executed based on a common H-Matrix also used for ECC decoding performed by the read control circuit 323 in some embodiments of the disclosure. In some embodiments of the disclosure, the read data control circuit 323 may be used with different write data control circuits.

Figure 3D:
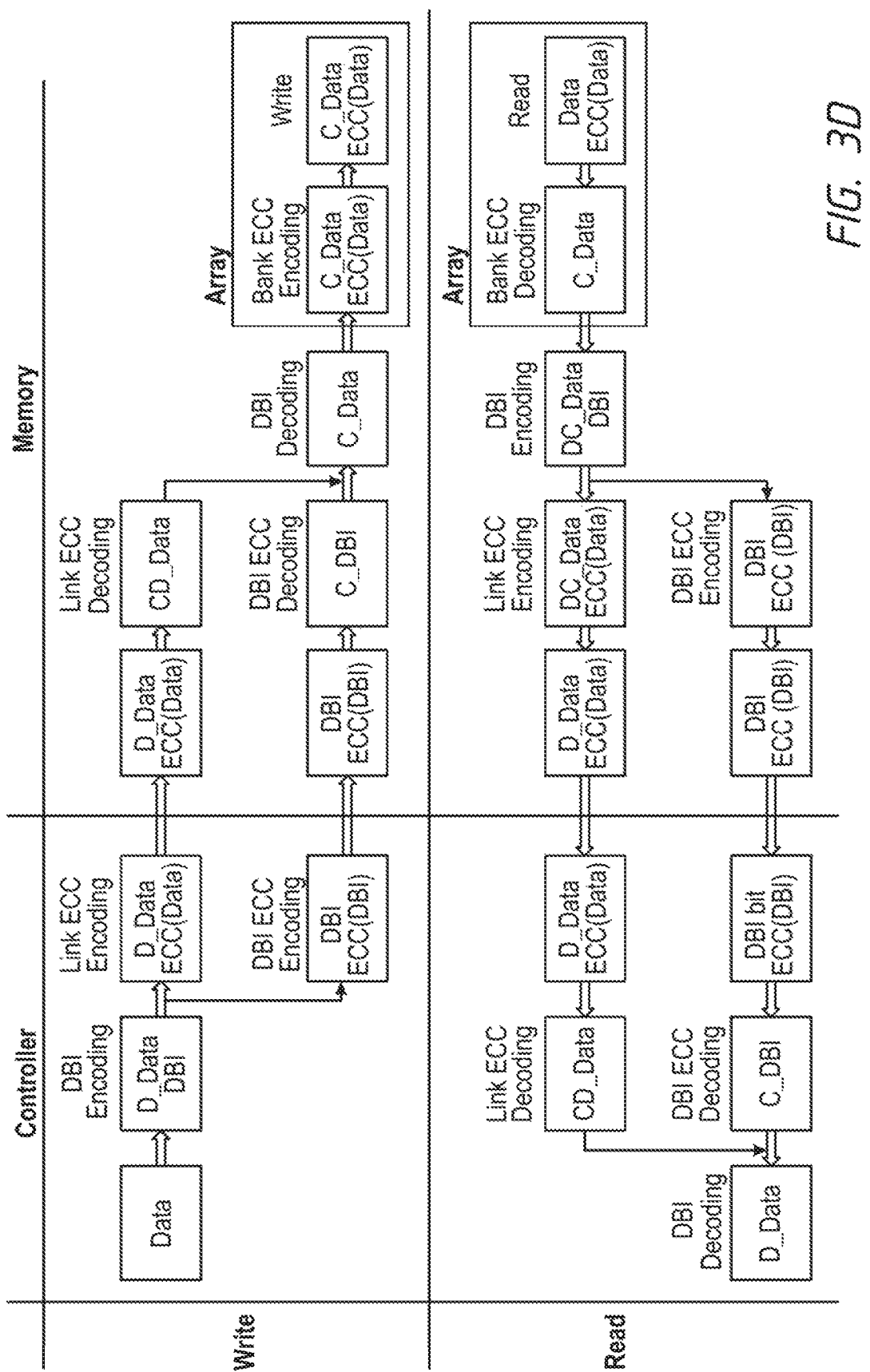
FIG. 3D is a flow diagram for error correction coding between a controller and memory according to an embodiment of the disclosure.

FIG. 3D is a flow diagram for error correction coding between a controller and memory according to an embodiment of the disclosure. A flow for writing data to the memory is shown in the upper half of the diagram and a flow for read data from the memory is shown in the lower half of the diagram. The flow for writing data for the memory may be performed in some embodiments of the disclosure by write data control circuit 313. The flow for reading data for the memory may be performed in some embodiments of the disclosure by read data control circuit 323. As shown in FIG. 3D, ECC decoding for write data and ECC decoding for DBI data are performed in parallel in the memory, and ECC encoding for read data and ECC encoding for DBI data are performed in parallel in the memory. As also shown in FIG. 3D, link ECC for correcting errors from transferring data between the controller and memory are performed separately (and serially) from bank ECC.

Figure 4:
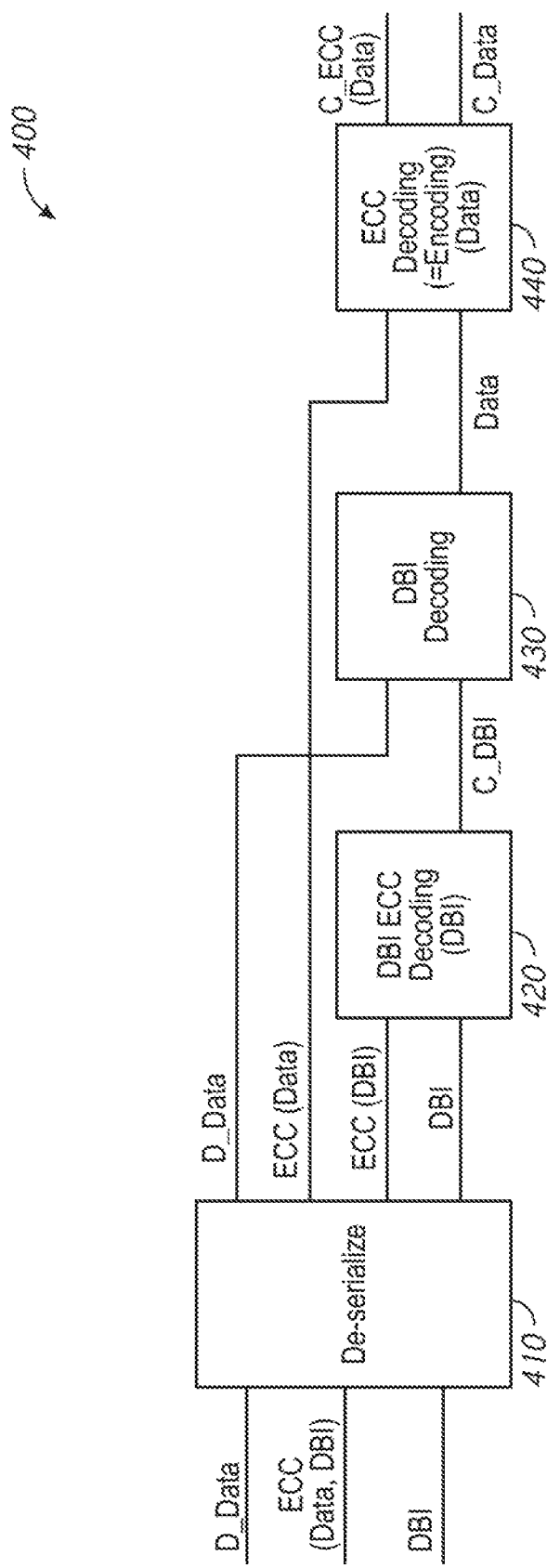
FIG. 4 is a block diagram of a write data control circuit according to an embodiment of the disclosure.

FIG. 4 is a block diagram of a write data control circuit 400 according to an embodiment of the disclosure. The write data control circuit 400 may be included in the write data control circuit 310 of the ECC control circuit 300 of FIG. 3A in some embodiments of the disclosure.

The write data control circuit 400 includes a de-serialize circuit 410 that is provided DBI encoded data "D_Data," ECC data "ECC (Data, DBI)," and DBI data "DBI." The ECC (Data, DBI) provided to the de-serialize circuit 410 may include ECC data for the data that is DBI encoded "ECC (Data)" and ECC data for the DBI data "ECC (DBI)." The D_Data, ECC (Data, DBI), and DBI data may be provided to the de-serialize circuit 410 in a serial manner, that is, as a plurality of bits provided consecutively to the de-serialize circuit 410. Each of the bits may be provided with a timing that is synchronized with a clock, for example, a data clock.

The de-serialize circuit 410 de-serializes the D_Data, ECC (Data, DBI), and DBI data and provides the D_Data, (ECC Data), ECC (DBI), and DBI data in a parallel manner. For example, N bits of D_Data may be consecutively received one-bit at a time over N/2 clock cycles of a data clock, and the de-serialize circuit 410 collects the N bits into a group and then provides all of the N bits of the D_Data concurrently. The serially provided bits of the ECC (Data, DBI), and DBI data are likewise collected into groups and provided by the de-serialize circuit 410 in parallel.

The write data control circuit 400 further includes an ECC decoding circuit 420. The ECC decoding circuit 420 is provided the ECC (DBI) and the DBI data from the de-serialize circuit 410. The ECC decoding circuit 420 corrects the DBI data using the ECC (DBI) and provides corrected DBI data "C_DBI." The C_DBI is provided along with the DBI encoded data D_Data to a DBI decoding circuit 430 that is also included in the write data control circuit 400. The DBI decoding circuit 430 decodes the D_Data using C_DBI to provide the plain (unencoded) "Data," which may be considered to be intermediate data. The write data control circuit 400 further includes an ECC decoding circuit 440. The Data is provided along with the ECC (Data) to the ECC decoding circuit 440 that corrects the Data using the ECC (Data) to provide corrected data "C_Data." The ECC decoding circuit 440 further provides the ECC (Data) as corrected ECC data "C_ECC (Data)." In some embodiments of the disclosure, the C_ECC (Data) is the same as the ECC (Data) used to correct the Data, and that was provided to the de-serialize circuit 410 along with ECC (DBI).

The C_Data and C_ECC (Data) may be provided by the write data control circuit 400 to be stored in a memory array, for example, in memory array 250 of the semiconductor device 200 of FIG. 2 in some embodiments of the disclosure.

The ECC data C_ECC (Data) for the C_Data may be provided by the write data control circuit 400 without the need for performing an ECC encoding operation on the C_Data prior to providing the C_Data and C_ECC (Data) for storing in memory. The C_ECC (Data) may be based on the ECC data ECC (Data) provided to the de-serialize circuit 410. For example, in some embodiments of the disclosure, the C_ECC (Data) is the same ECC (Data) that is provided to the de-serialize circuit 410. As previously described, by not performing an ECC encoding operation on the C_Data to provide the C_ECC (Data), the time to prepare the data and ECC data provided by the write data control circuit 400 may be reduced compared to the conventional approach.

Figure 5A:
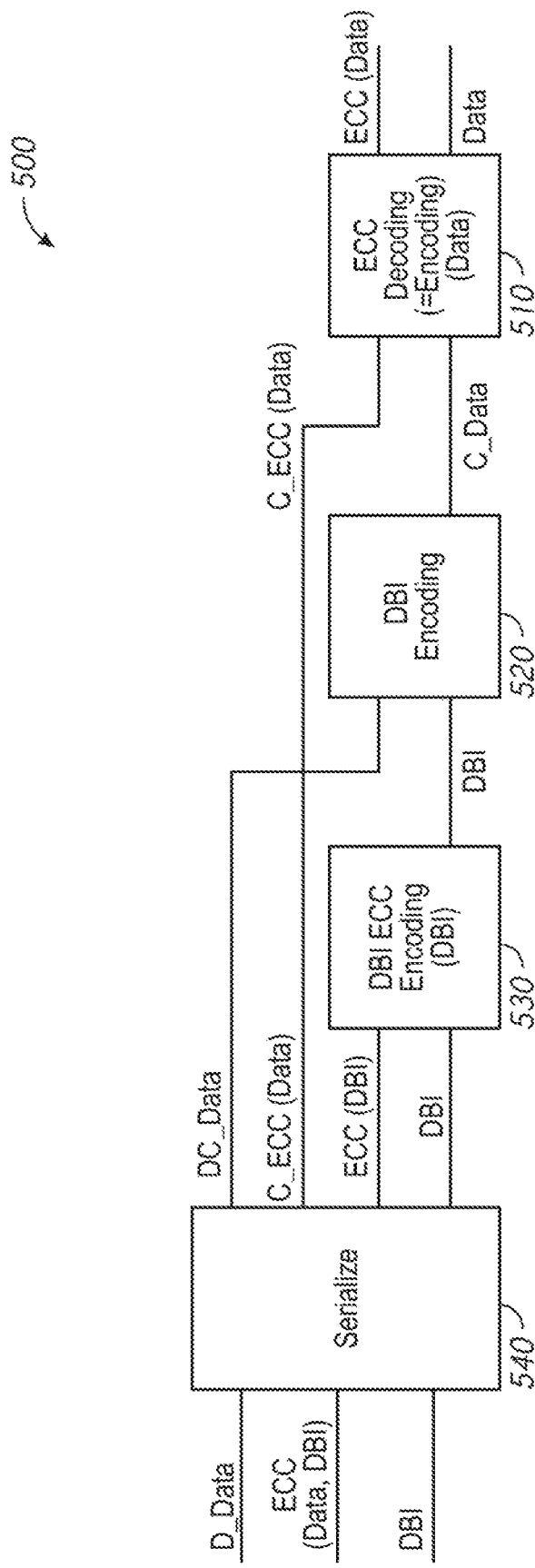
FIG. 5A is a block diagram of a read data control circuit according to an embodiment of the disclosure.

FIG. 5A is a block diagram of a read data control circuit 500 according to an embodiment of the disclosure. The read data control circuit 500 may be included in the read data control circuit 320 of the ECC control circuit 300 of FIG. 3A in some embodiments of the disclosure.

The read data control circuit 500 includes an ECC decoding circuit 510. The ECC decoding circuit 510 is provided "Data" and ECC data for the Data "ECC (Data)." The ECC decoding circuit 510 corrects the Data using the ECC (Data) to provide corrected data "C_Data," which may be considered to be intermediate data. The ECC decoding circuit 510 further provides the ECC (Data) as corrected ECC data "C_ECC (Data)." In some embodiments of the disclosure, the C_ECC (Data) is the same as the ECC (Data) used to correct the Data, and that was provided to the ECC decoding circuit 510 along with the Data.

The C_Data is provided to a DBI encoding circuit 520. The DBI encoding circuit 520 evaluates the C_Data and encodes the C_Data accordingly to provide DBI encoded corrected Data "DC_Data." The DBI encoding circuit 520 further provides DBI data "DBI" that indicates whether the DC_Data is true or the complement to the C_Data. The DBI data is provided to an ECC encoding circuit 530. The ECC encoding circuit 530 evaluates the DBI data and provides ECC data for the DBI data "ECC (DBI)" based on the DBI data. The ECC (DBI) may be used, for example, a controller, to correct the DBI data.

The ECC (DBI) and the DBI data are provided by the ECC encoding circuit 530 to a serialize circuit 540. The serialize circuit 540 is also provided the DC_Data and the C_ECC (Data). The serialize circuit 540 is provided the DC_Data, C_ECC (Data), DBI data, and ECC (DBI) in parallel, and serializes the same to provide the D_Data, DBI data, and ECC data for the D_Data and the DBI data "ECC (Data, DBI)" in a serial manner. The D_Data, DBI data, and ECC (Data, DBI) may be provided, for example, to a controller.

The ECC data C_ECC (Data) for the D_Data may be provided by the read data control circuit 500 without the need for performing an ECC encoding operation on the Data or C_Data. For example, the ECC data C_ECC (Data) may have been encoded using a common (e.g., same) determinant (e.g., H-Matrix) as is used for ECC decoding of the D_Data based on the C_ECC (Data), such as by the controller to which the C_ECC (Data) and D_Data are provided, and/or by a write data controller circuit which provides data and ECC (data) that is written to a memory array, and which may be later provided to the read data control circuit 500 for a read operation. By having the same ECC operations performed (e.g., by a controller and also by a semiconductor device) based on the same H-Matrix may allow for one or more ECC encoding operations of the D_Data to be avoided. The C_ECC (Data) may be based on the ECC data ECC (Data) that is provided to the ECC decoding circuit 510. For example, the ECC (Data) may be stored in a memory array with the Data, for example, which are provided together to the ECC decoding circuit 510. In some embodiments of the disclosure, the ECC (Data) provided by the read data control circuit 500 is the same as the ECC (Data) provided to the ECC decoding circuit 510. By not performing an ECC encoding operation on the Data or C_Data to provide the C_ECC (Data), the time to prepare the data and ECC data provided by the read data control circuit 500 may be reduced compared to the conventional approach.

In embodiments of the disclosure that include the read data control circuit 500, the write data control circuit 400 of FIG. 4 may be used to perform operations for providing the D_Data and ECC (Data) that is written to a memory array, which are later provided to the read data control circuit 500 responsive to a read operation. ECC decoding performed by the write data control circuit 400 may be executed based on a common H-Matrix also used for ECC decoding performed by the read control circuit 500 in some embodiments of the disclosure. In some embodiments of the disclosure, the read data control circuit 500 may be used with different write data control circuits.

Figure 5B:
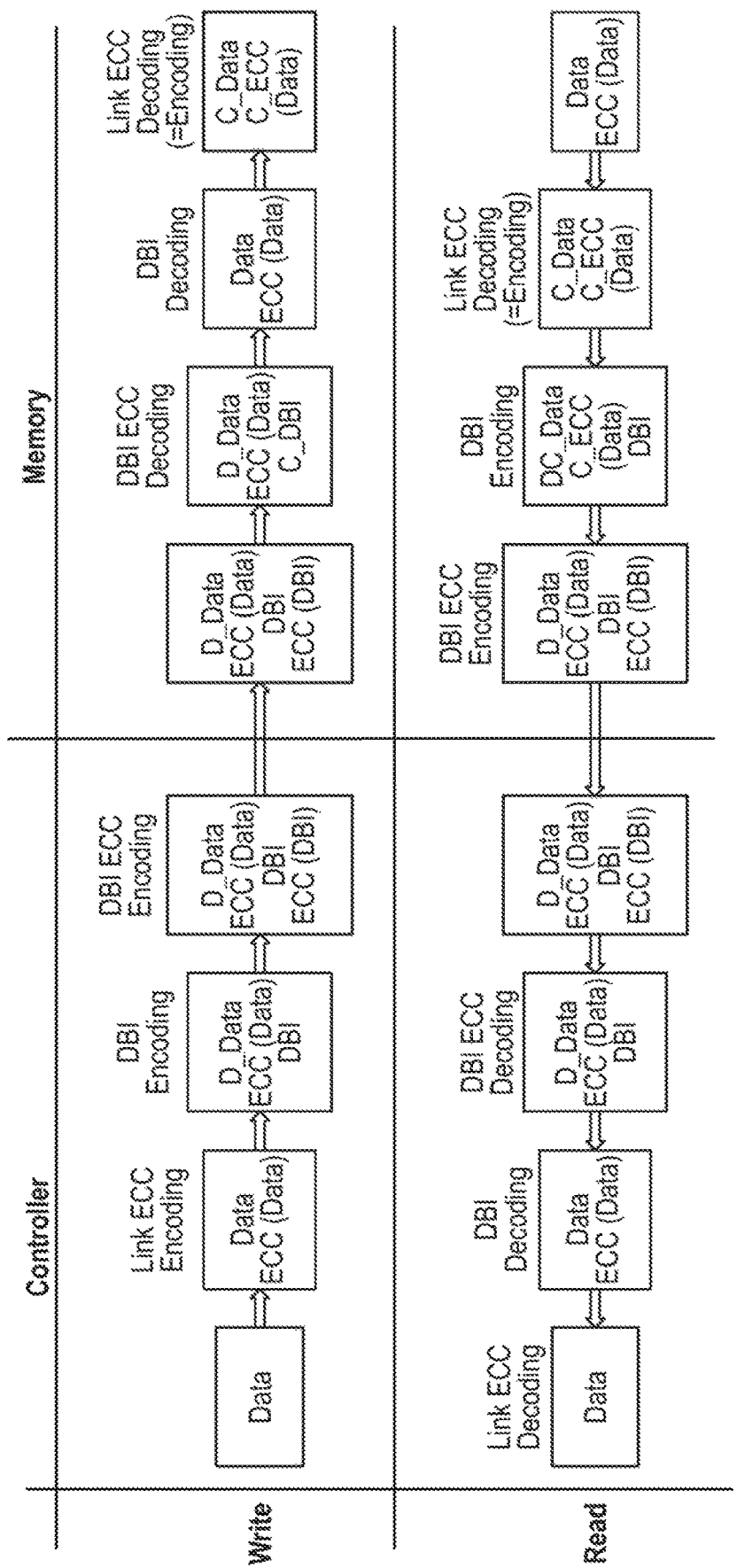
FIG. 5B is a flow diagram for error correction coding between a controller and memory according to an embodiment of the disclosure.

Figure 5B is a flow diagram for error correction coding between a controller and memory according to an embodiment of the disclosure. A flow for writing data to the memory is shown in the upper half of the diagram and a flow for read data from the memory is shown in the lower half of the diagram. The flow for writing data for the memory may be performed in some embodiments of the disclosure by write data control circuit 400. The flow for reading data for the memory may be performed in some embodiments of the disclosure by read data control circuit 500. As shown in FIG. 5B, ECC decoding for DBI data and ECC decoding for write data are performed serially in the memory, and ECC decoding for read data and ECC encoding for DBI data are performed serially in the memory. As also shown in FIG. 5B, ECC encoding is performed before DBI encoding in the controller. The reverse flow of ECC decoding after DBI decoding is applied by the memory.

Figure 6A:
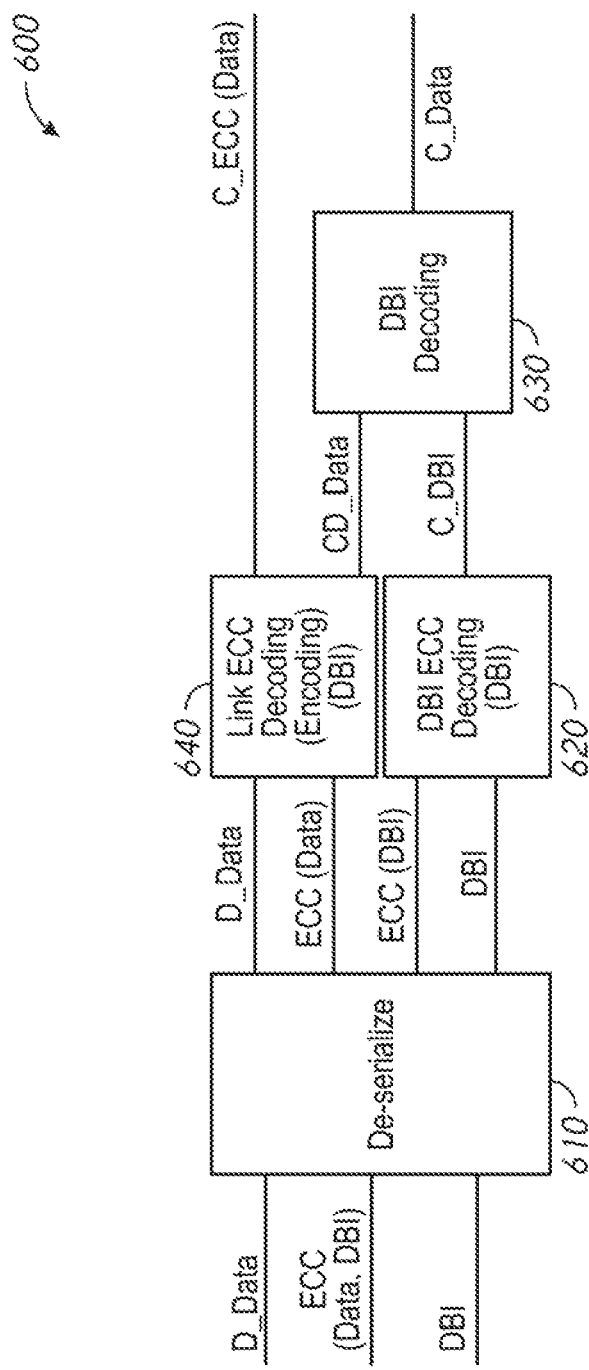
FIG. 6A is a block diagram of a write data control circuit according to an embodiment of the disclosure.

FIG. 6A is a block diagram of a write data control circuit 600 according to an embodiment of the disclosure. The write data control circuit 600 may be included in the write data control circuit 310 of the ECC control circuit 300 of FIG. 3A in some embodiments of the disclosure.

The write data control circuit 600 includes de-serialize circuit 610 that is provided DBI encoded data "D_Data," ECC data "ECC (Data, DBI)," and DBI data "DBI." The ECC (Data, DBI) provided to the de-serialize circuit 610 may include ECC data for the data that is DBI encoded "ECC (Data)" and ECC data for the DBI data "ECC (DBI)." The D_Data, ECC (Data, DBI), and DBI data may be provided in a serial manner. The de-serialize circuit 610 de-serializes the D_Data, ECC (Data, DBI), and DBI data and provides the D_Data, ECC (Data), ECC (DBI), and DBI data in a parallel manner. Serial and parallel manners of providing data were previously described with reference to FIG. 4.

The write data control circuit 600 includes an ECC decoding circuit 620. The ECC decoding circuit 620 is provided ECC (DBI) and the DBI data from the de-serialize circuit 610. The ECC decoding circuit 620 corrects the DBI data using the ECC (DBI) and provides corrected DBI data "C_DBI." The write data control circuit 600 further includes an ECC decoding circuit 640. The D_Data is provided along with the ECC (Data) to the ECC decoding circuit 640 which corrects the D_Data using the ECC (Data) to provide corrected DBI encoded data "CD_Data," which may be considered to be intermediate data. The ECC decoding circuit 640 further provides the ECC (Data) as corrected ECC data "C_ECC (Data)." In some embodiments of the disclosure, the C_ECC (Data) is the same as the ECC (Data) used to correct the Data, and that was provided to the de-serialize circuit 610 along with ECC (DBI).

The CD_Data is provided along with the C_DBI to a DBI decoding circuit 630 that is also included in the write data control circuit 600. The DBI decoding circuit 630 decodes the CD_Data using C_DBI to provide corrected data "C_Data."

In contrast to the write data control circuit 400 of FIG. 4, in the write data control circuit 600, ECC decoding for (DBI encoded) D_Data and ECC decoding for DBI data are performed in parallel by the ECC decoding circuit 640 and ECC decoding circuit 620, respectively. In the write data control circuit 400, ECC decoding of the DBI data by the ECC decoding circuit 420, DBI decoding of the D_Data by the DBI decoding circuit 430 to recover plain Data, and ECC decoding of the plain Data by the ECC decoding circuit 440 are performed serially. In such an arrangement, DBI decoding to provide the plain Data occurs prior to ECC decoding of the Data. However, in the arrangement of the write data control circuit 600, with the ECC decoding for D_Data and ECC decoding for DBI data performed in parallel, the ECC decoding of D_Data occurs prior to DBI decoding of (corrected) DBI encoded data CD_Data. As a result of the parallel operation of the write data control circuit 600, processing write data for writing to a memory array may take less time compared to the write data control circuit 400.

In embodiments of the disclosure that include the write data control circuit 600, the read data control circuit 500 of FIG. 5A may be used to perform operations for providing the D_Data, the DBI data, and ECC (Data, DBI) data for some embodiments. In other embodiments of the disclosure, the write data control circuit 600 may be used with different read data control circuits.

For embodiments of the disclosure, such as the write data control circuit 600, where DBI encoded data CD_Data is ECC decoded by an ECC decoding circuit, it is preferable that the results of ECC decoding of the DBI encoded data CD_Data provides the same calculation results as for ECC decoding of plain Data. That is, there would not be any problems with ECC decoding to correct an error in the DBI encoded data CD_Data.

Figure 6B:
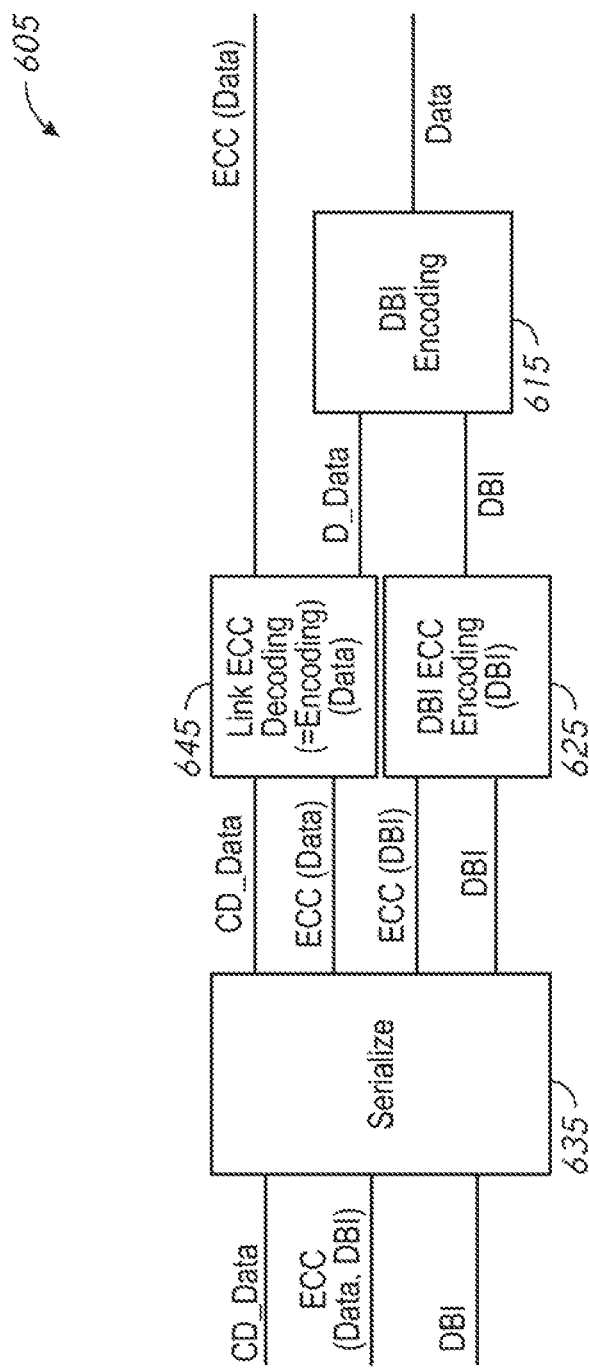
FIG. 6B is a block diagram of a read data control circuit according to an embodiment of the disclosure.

FIG. 6B is a block diagram of a read data control circuit 605 according to an embodiment of the disclosure. The read data control circuit 605 may be included in the read data control circuit 320 of the ECC control circuit 300 of FIG. 3A in some embodiments of the disclosure. The read data control circuit 605 may be used with the write data control circuit 600 in some embodiments of the disclosure.

The read data control circuit 605 is shown in FIG. 6B as receiving ECC (Data) and Data. The Data and ECC (Data) may be provided, for example, from a memory array. The Data is provided to a DBI encoding circuit 615. The DBI encoding circuit 615 evaluates the Data and encodes the Data accordingly to provide DBI encoded Data "D_Data." The DBI encoding circuit 615 further provides DBI data "DBI" that indicates whether the D_Data is true or the complement to the Data. The DBI data is provided to an ECC encoding circuit 625. The ECC encoding circuit 625 evaluates the DBI data and provides ECC data for the DBI data "ECC (DBI)" based on the DBI data. The ECC (DBI) may be used, for example, by a controller, to correct the DBI data.

The D_Data and the ECC (Data) are provided to an ECC decoding circuit 645. The ECC decoding circuit 645 corrects the D_Data using the ECC (Data) to provide corrected data "CD_Data," which may be considered to be intermediate data. The ECC decoding circuit 645 further provides the ECC (Data). The ECC (Data) may be used, for example, by the controller, to correct the D_Data. In some embodiments of the disclosure, the ECC (Data) provided by the ECC decoding circuit 645 is the same as the ECC (Data) used to correct the D_Data, and that was provided to the ECC decoding circuit 645 along with the D_Data.

In the read data control circuit 605, ECC decoding for D_Data and ECC encoding for DBI data are performed in parallel by the ECC decoding circuit 645 and ECC encoding circuit 625, respectively.

The ECC (DBI) and the DBI data are provided by the ECC encoding circuit 625 to a serialize circuit 635. The serialize circuit 635 is also provided the ECC (Data) and the CD_Data by the ECC encoding circuit 645. The serialize circuit 635 is provided the CD_Data, ECC (Data), DBI data, and ECC (DBI) in parallel, and serializes the same to provide CD_Data, DBI data, and ECC data for the D_Data and the DBI data "ECC (Data, DBI)" in a serial manner. The CD_Data, DBI data, and ECC (Data, DBI) may be provided, for example, to a controller.

The ECC data ECC (Data) for the CD_Data may be provided by the read data control circuit 605 without the need for performing an ECC encoding operation on the Data or D_Data. For example, the ECC data ECC (Data) may have been provided using a common (e.g., same) determinant (e.g., H-Matrix) as is used for ECC decoding of the CD_Data based on the ECC (Data), such as by the controller to which the ECC (Data) and CD_Data are provided, and/or by a read data controller circuit which provides data and ECC (data) that is read from a memory array. By having the same ECC operations performed (e.g., by a controller and also by a semiconductor device) based on the same H-Matrix may allow for one or more ECC encoding operations of the data to be avoided.

In embodiments of the disclosure that include the read data control circuit 605, the write data control circuit 600 of FIG. 6A may be used to perform operations for providing the C_Data and C_ECC (Data) that is written to a memory array, which are later provided to the read data control circuit 323 as Data and ECC (Data) responsive to a read operation. ECC decoding performed by the write data control circuit 600 may be executed based on a common H-Matrix also used for ECC decoding performed by the read control circuit 605 in some embodiments of the disclosure. In some embodiments of the disclosure, the read data control circuit 605 may be used with different write data control circuits.

Figures 7A-1, 7A-2:
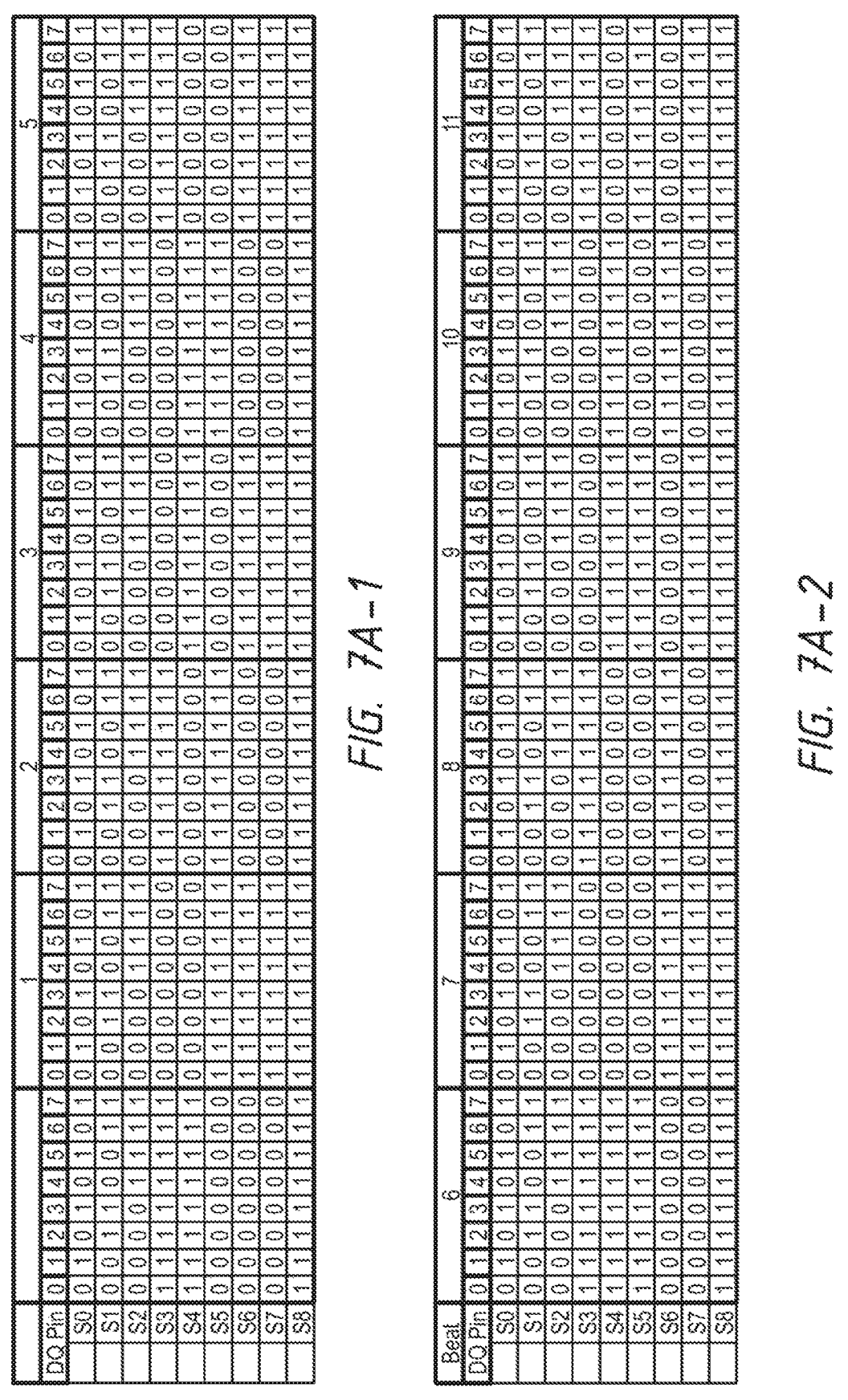
Figures 7A-3, 7B:
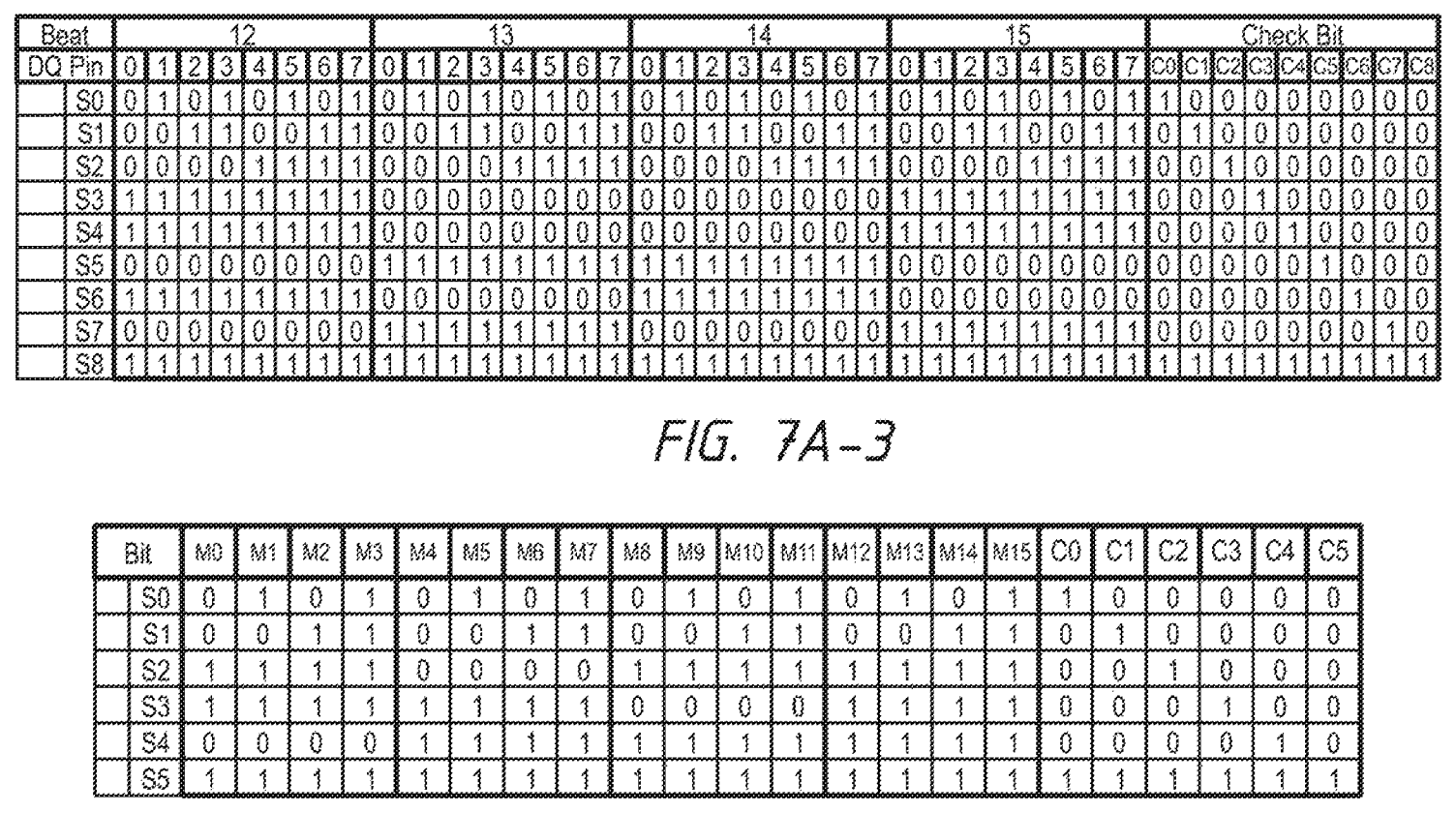

FIGS. 7A-1, 7A-2, and 7A-3, and 7B are diagrams of determinants (e.g., H-Matrices) for performing ECC encoding and/or decoding operations according to an embodiment of the disclosure. FIGS. 7A-1, 7A-2, and 7A-3 are examples determinants that may be used for data. FIG. 7B is an example determinant that may be used for DBI data. The example determinants of FIGS. 7A-1, 7A-2, and 7A-3, and 7B have an even number of "1" and "0" in each byte (S0, S1, . . . , S8). As a result, the example determinant of FIGS. 7A-1, 7A-2, and 7A-3, and 7B provide the same ECC calculation results for both plain data and DBI encoded data.

The determinants of FIGS. 7A-1, 7A-2, and 7A-3, and 7B may be used with, for example, error correction circuits similar to those disclosed in U.S. Pat. No. 9,690,653, previously referenced, and as previously described, the entire disclosure of which is hereby incorporated by reference. As described in the '653 patent, each syndrome factor (Si) may be constructed by EXOR circuits through each data enters through 1 in an H-matrix. Syndrome S (not zero) indicates the location of an error bit in case of 1 error and S=0. If the H-matrix has only an even number of "1" in each byte, the EXOR circuits output the same result. For example, inputs of the EXOR circuits change from 00000000 to 11111111 if Data is DBI encoded, however, the calculation results are the same "0" (no error). Similarly to that, inputs of EXOR circuits change from 00100000 to 11011111, however, the calculation results are the same "1" (error).

The example determinants of FIGS. 7A-1, 7A-2, and 7A-3, and 7B may be used with ECC decoding for DBI encoded data and ECC decoding for DBI data performed in parallel, and with ECC decoding of the DBI encoded data prior to DBI decoding of (corrected) DBI encoded data. Embodiments of the disclosure are not intended to be limited to the specific example determinants of FIGS. 7A-1, 7A-2, and 7A-3, and 7B, and as such, other embodiments of the disclosure use alternative determinants for the ECC decoding and/or encoding.

Figure 8A:
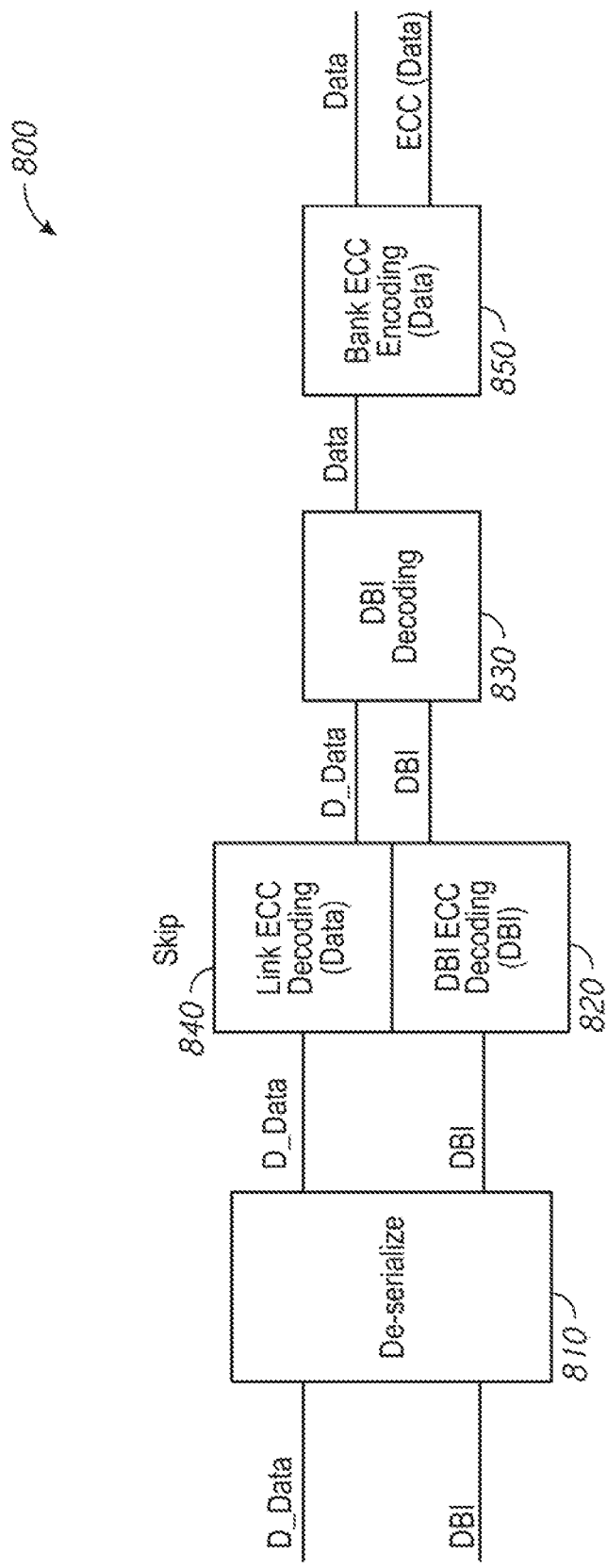
FIG. 8A is a block diagram of a write data control circuit according to an embodiment of the disclosure.

FIG. 8A is a block diagram of a write data control circuit 800 according to an embodiment of the disclosure. The write data control circuit 800 may be included in the write data control circuit 310 of the ECC control circuit 300 of FIG. 3A in some embodiments of the disclosure.

The write data control circuit 800 includes de-serialize circuit 810 that is provided DBI encoded data "D_Data" and DBI data "DBL." The D_Data and DBI data may be provided in a serial manner, and the de-serialize circuit 810 de-serializes the D_Data and DBI data and provides the D_Data and DBI data in a parallel manner.

The write data control circuit 800 further includes ECC decoding circuit 820 and ECC decoding circuit 840. In the write data control circuit 800, it is assumed that the ECC decoding circuits 820 and 830 are disabled and bypassed (e.g., skipped) because only DBI encoded data D_Data and the DBI data are provided to the write data control circuit 800. As a result, the D_Data and the DBI data are provided through the ECC decoding circuit 840 and the ECC decoding circuit 820, respectively, to a DBI decoding circuit 830 included in the write data control circuit 800. The DBI decoding circuit 830 decodes the D_Data using DBI data to provide DBI decoded data "Data." The Data is provided by the write data control circuit 800 to an ECC encoding circuit 850. The ECC encoding circuit 850 evaluates the Data and provides ECC data for the Data "ECC (Data)." The Data and the ECC (Data) may be stored in a memory array, for example, in memory array 250 of the semiconductor device 200 of FIG. 2. The ECC encoding circuit 850 provides bank error correction coding, which may be used to correct errors that may have occurred while stored in the memory array.

In embodiments of the disclosure that include the write data control circuit 800, the read data control circuit 500 of Figure 5A may be included as well to perform operations for providing the D_Data and DBI data. In such embodiments, the ECC decoding circuit 510 does not provide corrected ECC data (e.g., C_ECC (Data)) and the ECC encoding circuit 530 is disabled so that ECC data for the DBI data (e.g., ECC (DBI)) is also not provided. As a result, only DBI encoded data D_Data and DBI data are provided by the read data control circuit 500. The D_Data and DBI data may be provided, for example, to a controller. In other embodiments of the disclosure, the write data control circuit 800 may be used with different read data control circuits.

Figure 8B:
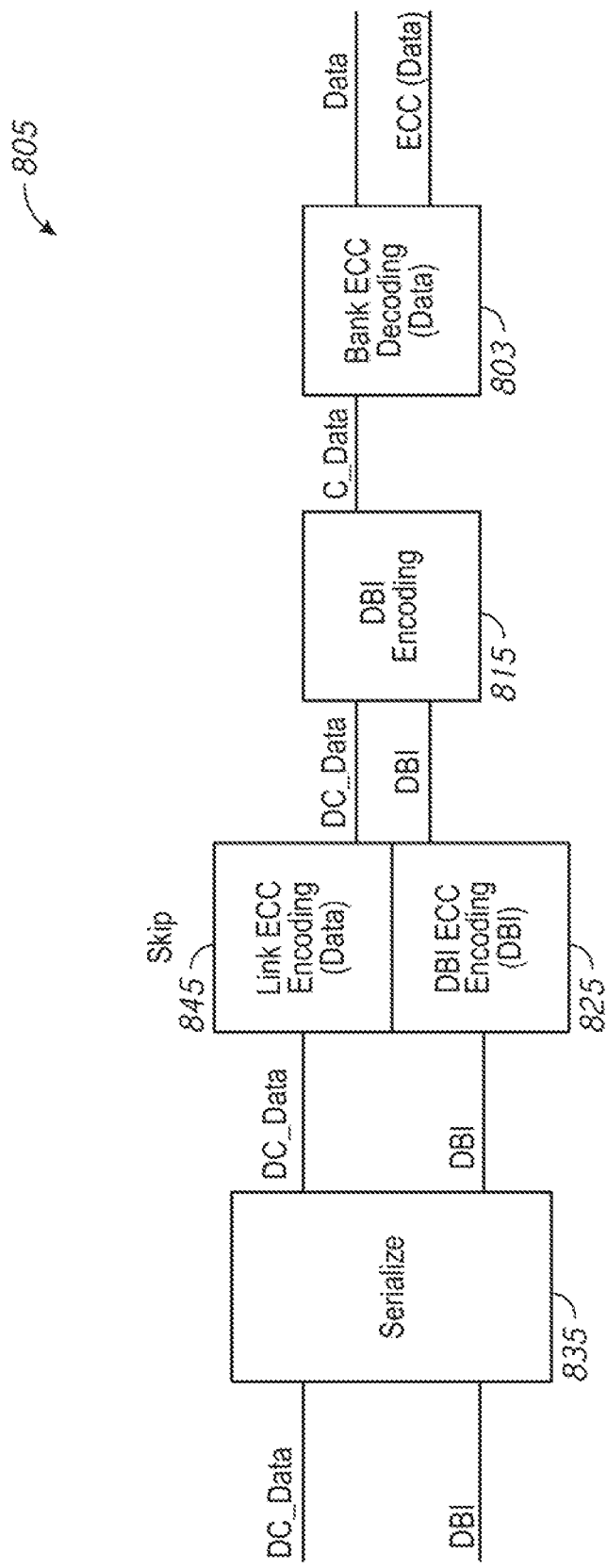
FIG. 8B is a block diagram of a read data control circuit according to an embodiment of the disclosure.

FIG. 8B is a block diagram of a read data control circuit 805 according to an embodiment of the disclosure. The read data control circuit 805 is shown in FIG. 8B as receiving corrected data C_Data from bank ECC decoding circuit 803. The read data control circuit 805 may be included in the read data control circuit 320 of the ECC control circuit 300 of FIG. 3A in some embodiments of the disclosure. The read data control circuit 805 may be used with the write data control circuit 800 in some embodiments of the disclosure.

The bank ECC decoding circuit 803 is provided "Data" and ECC data for the Data "ECC (Data)," for example, from a memory array. The bank ECC decoding circuit 803 corrects the Data using the ECC (Data) to provide corrected data "C_Data," which may be considered to be intermediate data. As previously described, bank error correction coding may be used for correcting any errors that may have occurred while stored in the memory array.

The read data control circuit 805 is shown in FIG. 8B as receiving C_Data from the bank ECC decoding circuit 803. The C_Data is provided to a DBI encoding circuit 815. The DBI encoding circuit 815 evaluates the Data and encodes the Data accordingly to provide DBI encoded Data "DC_Data." The DBI encoding circuit 815 further provides DBI data "DBI" that indicates whether the DC_Data is true or the complement to the C_Data. The DBI data is provided to an ECC encoding circuit 825 and the DC_Data is provided to an ECC encoding circuit 845.

In the read data control circuit 805, it is assumed that the ECC encoding circuits 825 and 845 are disabled and bypassed and ECC data ECC (Data) and ECC (DBI) are not provided by the read data control circuit 805. As a result, the DC_Data and the DBI data are provided through the ECC decoding circuit 845 and the ECC decoding circuit 825, respectively, to a serialize circuit 835 that serializes the same to provide DC_Data and DBI data in a serial manner. The DC_Data and DBI data may be provided, for example, to a controller.

Figure 9:
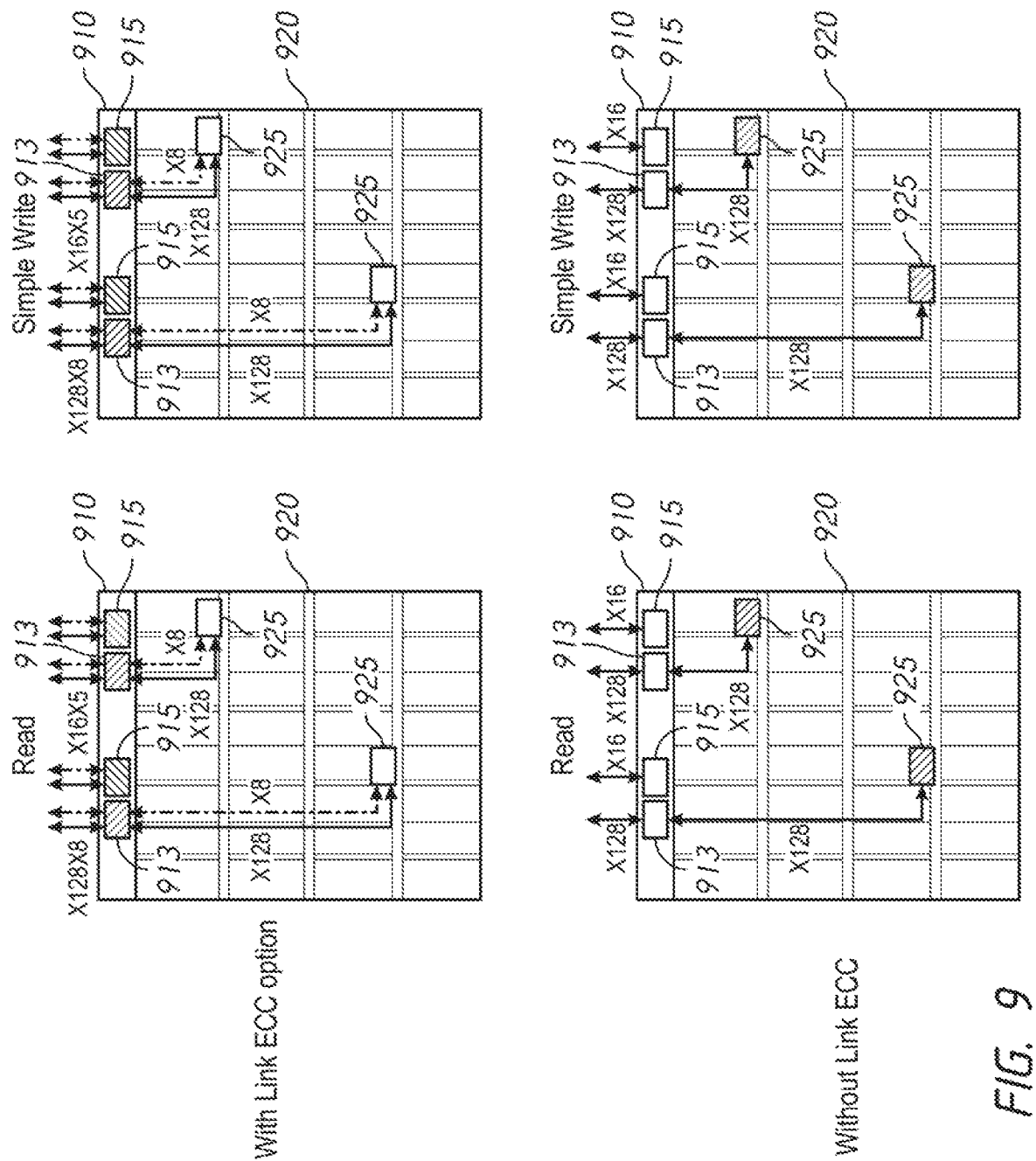
FIG. 9 is a layout diagram for write data control circuits and read data control circuits according to various embodiments of the disclosure.

In embodiments of the disclosure that include the write data control circuit 800, the read data control circuit 805 may be included as well to perform operations for providing the DC_Data and DBI data. In other embodiments of the disclosure, the read data control circuit 805 may be used with different write data control circuits. FIG. 9 is a layout diagram for write data control circuits and read data control circuits according to various embodiments of the disclosure. The layout diagrams include a peripheral region 910 and a memory array region 920.

For write data control circuits, ECC decoding (DBI) and DBI decoding may be performed by circuits in the peripheral region 910, for example, circuits located in areas 913 and 915, respectively. ECC decoding (Data) for the write data control circuits may be performed by circuits in the peripheral region 910 or in the memory cell array region 920. When performed by circuits in the memory cell array region 920, the circuits may be located, for example, in areas 925. However, ECC decoding (Data) may be preferable in the peripheral region 910 in order to avoid having additional signal lines in the memory cell array region 920.

For read data control circuits, ECC encoding (DBI) and DBI encoding may be performed by circuits in the peripheral region 910, for example, circuits located in areas 913 and 915, respectively. ECC decoding (Data) for the read data control circuits may be performed by circuits in the peripheral region 910 or in the memory cell array region 920, in the same manner as previously described for the write data control circuits.

In embodiments of write data control circuits that are provided DBI encoded data D_Data and DBI data (no ECC data for either the data or DBI data), the additional ECC encoding (Data) may be arranged in the memory cell array region 920, which may reduce the number of signal lines extending from the peripheral region 910 to the memory cell array region 920, which may be relatively long signal lines. Reducing the number of relatively long signal lines may decrease power consumption. Likewise, ECC decoding (Data) for read data control circuits may be arranged in the memory cell array regions 920.

The layouts of FIG. 9 have been provided by way of example, and are not intended to limit the scope of the disclosure to the particular layouts in the examples of FIG. 9. Consequently, other embodiments of the disclosure may include layouts for the write data control circuits and read data control circuits other than those shown in FIG. 9.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   an I/O circuit configured to receive first data and first ECC data associated with the first data;
   a memory array; and
   a control circuit coupled between the I/O circuit and the memory array, the control circuit configured to execute first ECC-decoding to produce corrected first data and corrected first ECC data responsive, at least in part, to the first data and the first ECC data, the control circuit further configured to store both the corrected first data and the corrected first ECC data into the memory array;
   wherein the control circuit is further configured to receive second data and second ECC data corresponding to the second data from the memory array, execute second ECC-decoding to produce corrected second data and corrected second ECC data, and transmit the corrected second data and the corrected second ECC data to the I/O circuit.

2. The apparatus of claim 1, wherein each of the first ECC-decoding and the second ECC-decoding is executed based on a common H-matrix.

3. An apparatus, comprising:
   an I/O circuit configured to receive first data and first ECC data associated with the first data;
   a memory array; and
   a control circuit coupled between the I/O circuit and the memory array, the control circuit configured to execute first ECC-decoding to produce corrected first data and corrected first ECC data responsive, at least in part, to the first data and the first ECC data, the control circuit further configured to store both the corrected first data and the corrected first ECC data into the memory array;
   wherein the I/O circuit is further configured to receive DBI data and second ECC data corresponding to the DBI data, and the first data is DBI-encoded based on the DBI data;
   wherein the control circuit is further configured to execute second ECC-decoding on the DBI data responsive to the second ECC data to produce corrected DBI data and execute DBI-decoding on the first data responsive to the corrected DBI data to produce an intermediate first data; and
   wherein the first ECC-decoding is executed on the intermediate first data and the first ECC data to produce the corrected first data and the corrected first ECC data.

4. An apparatus, comprising:
   an I/O circuit configured to receive first data and first ECC data associated with the first data;
   a memory array; and
   a control circuit coupled between the I/O circuit and the memory array, the control circuit configured to execute first ECC-decoding to produce corrected first data and corrected first ECC data responsive, at least in part, to the first data and the first ECC data, the control circuit further configured to store both the corrected first data and the corrected first ECC data into the memory array;
   wherein the I/O circuit is further configured to receive DBI data and second ECC data corresponding to the DBI data, and the first data is DBI-encoded based on the DBI data; and
   wherein the first ECC-decoding is executed on the first data and the first ECC data to produce an intermediate first data and the corrected first ECC data; and wherein the control circuit is further configured to execute a second ECC-decoding on the DBI data and the second ECC data to produce corrected DBI data and execute DBI-decoding on the intermediate first data responsive to the corrected DBI data to produce the corrected first data.

5. The apparatus of claim 4, wherein the control circuit is further configured to receive second data and second ECC data corresponding to the second data from the memory array, execute a third FCC-decoding on the second data and the second ECC data to produce intermediate second data and corrected second ECC data, execute DBI-encoding on the intermediate second data to produce corrected second data and additional DBI data, execute FCC-encoding on the additional DBI data to produce a third ECC data and transmit the corrected second data, corrected second ECC data, additional DBI data and the third ECC data to the I/O circuit.

6. An apparatus comprising:
an I/O circuit configured to receive first data, data-bus-inversion (DBI) data related to the first data, first FCC data associated with the first data and second ECC data associated with the DBI data;
a memory array; and
a control circuit coupled between the I/O circuit and the memory cell array, the control circuit comprising a first FCC-decoding circuit, a second FCC-decoding circuit and a DBI-decoding circuit;
wherein the second FCC-decoding circuit is configured to produce corrected DBI data responsive, at least in part, to the DBI data and the second ECC data;
wherein the first ECC-decoding circuit and the DBI-decoding circuit are configured to produce corrected and DBI-decoded first data and corrected first FCC data responsive, at least in part, to the first data, the first ECC data and the corrected DBI data; and
wherein the control circuit is configured to store both the corrected and DBI decoded first data and the corrected first ECC data into the memory array.

7. The apparatus of claim 6, wherein the DBI-decoding circuit is further configured to receive the first data and the corrected DBI data and produce DBI decoded first data; and
wherein the first ECC-decoding circuit is further configured to receive the DBI decoded first data and the first ECC data and produce the corrected and DBI decoded first data and the corrected first ECC data.

8. The apparatus of claim 6, wherein the first ECC-decoding circuit is further configured to receive the first data and the first ECC data and produce corrected first data and corrected first ECC data; and
wherein the DBI-decoding circuit is further configured to receive the corrected first data and the corrected DBI data and produce the corrected and DBI decoded first data.

9. The apparatus of claim 6, wherein the first ECC-decoding circuit is further configured to receive second data and third ECC data from the memory array and produce corrected second data and corrected third ECC data.

10. The apparatus of claim 9, wherein the control circuit further comprises a DBI-encoding circuit and an ECC-encoding circuit;
wherein the DBI-encoding circuit is configured to produce additional DBI data responsive to the corrected second data; and
wherein the ECC-encoding circuit is configured to produce a fourth ECC data responsive to the additional DBI data.

11. The apparatus of claim 10, wherein the I/O circuit is further configured to externally output third data, the additional DBI data, the corrected third ECC data and the fourth ECC data;
wherein the third data is produced responsive to the corrected second data and the additional DBI data.

12. An apparatus, comprising:
a write data control circuit configured to receive write data and corresponding ECC data from signal busses and to correct the write data based on the corresponding ECC data to provide corrected write data, the write control circuit further configured to provide corrected corresponding ECC data based on the corresponding ECC data, wherein the corrected write data and the corrected corresponding ECC data are provided to be stored in a memory array; and
a read data control circuit configured to receive read data and corresponding ECC data from the memory array and to correct the read data based on the corresponding ECC data to provide corrected read data, the read control circuit further configured to provide corrected corresponding ECC data based on the corresponding ECC data, wherein the corrected read data and the corrected corresponding ECC data are provided to the signal busses, the read data control circuit includes a DBI encoding circuit further configured to DBI encode the corrected read data and ECC encode DBI data to provide ECC data corresponding to the DBI data, wherein the DBI data and the ECC data corresponding to the DBI data are also provided to the signal busses.

13. An apparatus, comprising:
a write data control circuit configured to receive write data and corresponding EEC data from signal busses and to correct the write data based on the corresponding ECC data to provide corrected write data, the write control circuit further configured to provide corrected corresponding ECC data based on the corresponding ECC data, wherein the corrected write data and the corrected corresponding ECC data are provided to be stored in a memory array; and
a read data control circuit configured to receive read data and corresponding ECC data from the memory array and to correct the read data based on the corresponding ECC data to provide corrected read data, the read control circuit further configured to provide corrected corresponding ECC data based on the corresponding ECC data, wherein the corrected read data and the corrected corresponding ECC data are provided to the signal busses;
wherein the write data is DBI encoded and wherein the write data control circuit includes an ECC decoding circuit configured to receive DBI data and corresponding ECC data from the signal busses and to correct the DBI data to provide corrected DBI data.

14. The apparatus of claim 13 wherein the write data control circuit includes a DBI decoding circuit configured to DBI decode the write data based on the corrected DBI data before correcting the write data based on the corresponding ECC data.

15. The apparatus of claim 13 wherein the write data control circuit includes a DBI decoding circuit configured to DBI decode the write data based on the corrected DBI data after correcting the write data based on the corresponding ECC data.

16. The apparatus of claim 13 wherein the write data control circuit includes a first ECC decoding circuit configured to correct the write data based on the ECC data corresponding to the write data in parallel with a second ECC decoding circuit configured to correct the DBI data based on the ECC data corresponding to the DBI data.

17. The apparatus of claim 16 wherein the ECC decoding circuit is configured to correct the write data based on the ECC data according to a determinant that provides the same ECC calculation results for both plain data and DBI encoded data.

18. The apparatus of claim 16 wherein the ECC decoding circuit is configured to correct the write data based on the ECC data according to a determinant that includes an even number of "1" and "0" in each byte.

19. An apparatus, comprising:
a write data control circuit configured to receive write data and corresponding ECC data from signal busses and to correct the write data based on the corresponding ECC data to provide corrected write data, the write control circuit further configured to provide corrected corresponding ECC data based on the corresponding ECC data, wherein the corrected write data and the corrected corresponding ECC data are provided to be stored in a memory array;
a read data control circuit configured to receive read data and corresponding ECC data from the memory array and to correct the read data based on the corresponding ECC data to provide corrected read data, the read control circuit further configured to provide corrected corresponding ECC data based on the corresponding ECC data, wherein the corrected read data and the corrected corresponding ECC data are provided to the signal busses; and
a bank ECC encoding circuit configured to perform error correction coding for the corrected write data before being stored in the memory array.

20. An apparatus, comprising:
a write data control circuit configured to receive write data and corresponding ECC data from signal busses and to correct the write data based on the corresponding ECC data to provide corrected write data, the write control circuit further configured to provide corrected corresponding ECC data based on the corresponding ECC data, wherein the corrected write data and the corrected corresponding ECC data are provided to be stored in a memory array;
a read data control circuit configured to receive read data and corresponding ECC data from the memory array and to correct the read data based on the corresponding ECC data to provide corrected read data, the read control circuit further configured to provide corrected corresponding ECC data based on the corresponding ECC data, wherein the corrected read data and the corrected corresponding ECC data are provided to the signal busses; and
a bank ECC decoding circuit configured to perform error correction for the read data before being provided to the read data control circuit.

* * * * *